United States Patent [19]

Yamamoto

[11] Patent Number: 5,548,083
[45] Date of Patent: Aug. 20, 1996

[54] SHIELDED MOLDED PLASTIC COVER

[75] Inventor: Takashi Yamamoto, Kawasaki, Japan

[73] Assignee: Fujitsu Limited, Kawasaki, Japan

[21] Appl. No.: 390,776

[22] Filed: Feb. 17, 1995

[30] Foreign Application Priority Data

Feb. 21, 1994 [JP] Japan .................................. 6-022448
Feb. 23, 1994 [JP] Japan .................................. 6-025588
Oct. 12, 1994 [JP] Japan .................................. 6-246468

[51] Int. Cl.$^6$ ........................................................ H05K 9/00
[52] U.S. Cl. ................................. 174/35 GC; 277/901; 361/818
[58] Field of Search ........................... 174/35 R, 35 GC, 174/50, 52.1, 65 R; 361/816, 818; 277/901

[56] References Cited

U.S. PATENT DOCUMENTS

| | | | |
|---|---|---|---|
| 4,825,015 | 2/1988 | Prott et al. | 174/35 GC |
| 4,841,102 | 2/1988 | Elsner et al. | 174/35 GC |
| 5,194,691 | 11/1990 | McIlwraith | 174/35 GC |
| 5,473,111 | 9/1993 | Hattori et al. | 174/35 R |

Primary Examiner—Kristine L. Kincaid
Assistant Examiner—Robert J. Decker
Attorney, Agent, or Firm—Armstrong, Westerman, Hattori, McLeland & Naughton

[57] ABSTRACT

A cover unit is constituted such that a conductive member is provided on the entirety of the inner wall of a hollow cover, and the periphery of the conductive member is fixed to the cover.

19 Claims, 22 Drawing Sheets

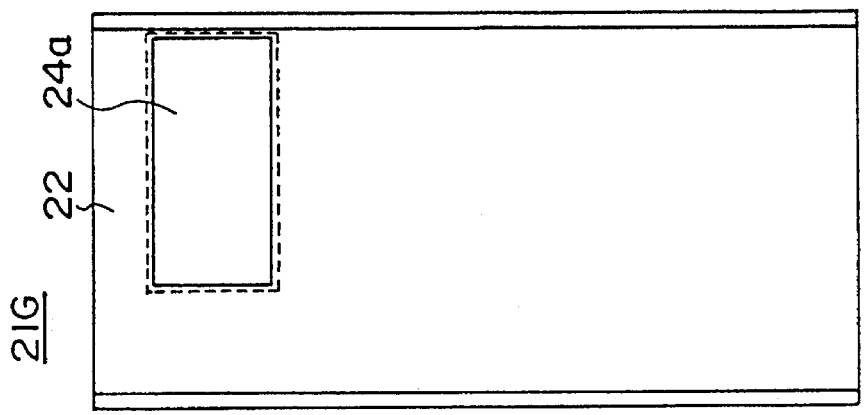
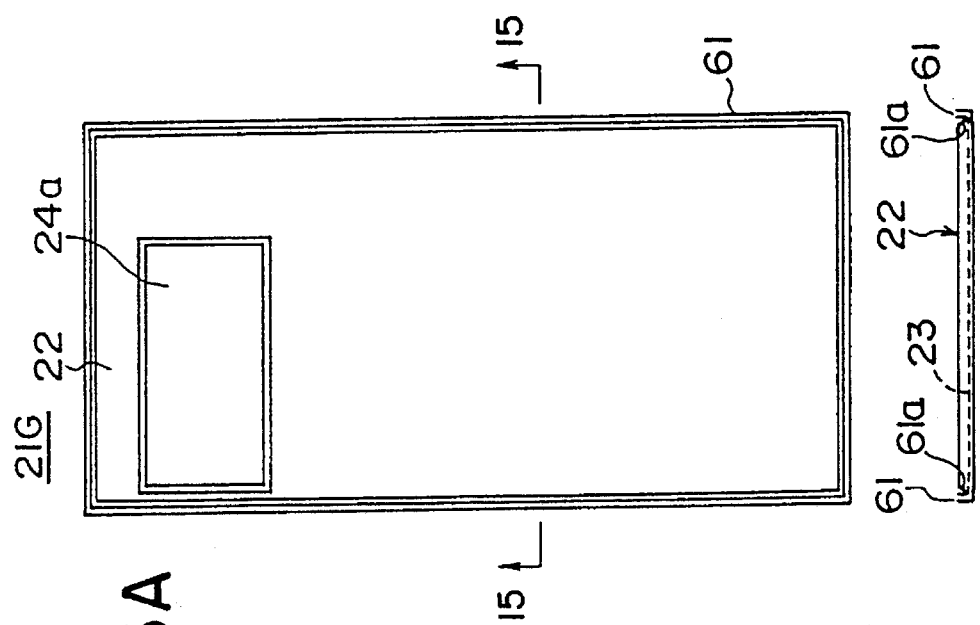

SHIELDED MOLDED PLASTIC COVER

BACKGROUND OF THE INVENTION

1. Field of the Invention

The present invention relates to molded plastic products, methods for producing the same, and apparatuses for producing the same.

Recently, it is required, particularly recently, to provide electromagnetic shielding so that electromagnetic noise produced in electronic appliances such as computers, communication equipment and office automation equipment be prevented from radiating outside, or external electromagnetic noise do not invade the equipment. While electromagnetic shielding is easily effected by using a metal body, special consideration must be given when a molded plastic product is used as a body because various requirements including weight, cost and appearance have to be met.

2. Prior Art

FIGS. 1A and 1B are diagrams which explain conventional covers having a shielding capability. FIG. 1A shows a plastic door 11 used as a cover for providing electromagnetic shielding for a large information processing unit. A conductive body 13 formed into a metal plate or a wire netting is fixed to the inner wall of a main unit 12 formed of a plastic material by a fixing means 14 such as a screw so that electromagnetic shielding is effected by the door.

FIG. 1B shows electromagnetic shielding of a relatively small electronic apparatus 15 like a personal computer, wherein a body 16 is made of a plastic material. Since the body 16 is not conductive, parts 17 are accommodated in a case 18 formed of a sheet metal.

However, the door 11 shown in FIG. 1A has a problem in that the number of processes required is great because the conductive body 13 is fixed to the main unit 12 built by molding.

The construction shown in FIG. 1B has a problem in that the number of parts and the production cost are great because the parts 17 are accommodated in the case 18.

In order to eliminate the need to provide the conductive body of FIG. 1A and the case 18 of FIG. 1B, there is proposed electromagnetic shielding by applying conductive paint on the plastic door 11 or the body 16, or by mixing metal filler in the material forming the door or the body so as to achieve conductivity. However, such an approach has a problem in that recycling of the material is difficult and the production cost is high.

SUMMARY OF THE INVENTION

Accordingly, an object of the present invention is to provide molded plastic products, methods for producing the same, and apparatuses for producing the same in which the above-mentioned problems are eliminated.

Another and more specific object of the present invention is to provide a molded plastic product that is produced easily and inexpensively, methods for producing the same easily and inexpensively, and apparatuses for producing the same easily and inexpensively.

In order to achieve the aforementioned objects, the present invention provides a molded plastic product comprising:

a molded plastic part of a predetermined size having a hollow space; and a shielding part which, provided on the entirety of a plane in the hollow space of the molded plastic part, effects electromagnetic shielding. The shielding part may be a wire netting having the periphery thereof firmly fixed to the molded plastic part.

In accordance with another aspect of the present invention, the shielding part is fixed to an inner wall of one of opposite sections of the molded plastic part by an adhesive member.

In accordance with still another aspect of the present invention, the shielding part is fixed to an inner wall of one of opposite sections of the molded plastic part by an adhesive member. According to this aspect of the present invention, it is possible to prevent the shielding part from becoming loose in the hollow area in the molded plastic part.

In accordance with still another aspect of the present invention, a lead part at the periphery of the shielding part is allowed to go out from the molded plastic part via an opening, and a conductive member electrically connected to the lead part via a stopper and a conductive connecting member is on the periphery of one of the opposite sections of the molded plastic part.

In accordance with yet another aspect of the present invention, a conductive member is provided at the periphery of one of the opposite sections of the molded plastic part, and a projection provided in the other of the opposite sections of the molded plastic part presses the shielding part at a position on the inner wall of the molded plastic part which position corresponds to the conductive member.

In accordance with still another aspect of the present invention, a holding groove is formed in one of the opposite sections of the molded plastic part, and a conductive member electrically connected to the bottom of the holding groove is provided in the holding groove, the holding groove and the inner wall of the other of the opposite sections of the molded plastic part sandwich the shielding part, and a conductive inserted member is disposed between the holding groove and the conductive member as the case may be.

In accordance with still another aspect of the present invention, the holding groove into which the conductive member is press-fitted is formed by forming a projection at the periphery of one of the opposite sections of the molded plastic part, wherein the projection is formed so as to separate the hollow area and the holding groove or so as to allow air to flow between the hollow area and the holding groove.

In accordance with yet another aspect of the present invention, a stopper is press-fitted to the molded plastic part which accommodates the shielding part, a conductive member being disposed between the stopper and the molded plastic part.

In accordance with yet another aspect of the present invention, the molded plastic part having a shielding part is used in a part or the whole of a body of electronic equipment such as an information processing unit, wherein electrical connection is established between the shielding part in the molded plastic part and the frame of the electronic equipment.

The advantage of the molded plastic product of the present invention is that the production thereof is easy and requires less cost than the conventional art. Other advantages include easiness of recycling and improvement in electromagnetic shielding effect.

The aforementioned objects can also be achieved by a method for producing a molded plastic product, comprising the steps of:

sandwiching a shielding part between two plastic sheets so as to form a molded member;

heating the molded member so as to soften the plastic sheet;

introducing a compressed gas to be into the molded member in a die having a cavity of a predetermined configuration, so as to form a molded plastic part including the shielding part and having a hollow cross section. The shielding part may be sandwiched between the two plastic sheets by fixing the shielding part to one of the sheets using a thermosetting adhesive as the case may be, whereupon the plastic sheets are softened by heating the sheets using a heating means, and a compressed air is introduced into a space between the sheets held within the die so that the molded plastic part having a hollow cross section is formed.

The advantage of the above-described method is that the production of a plastic molded part which has a shielding part is easy and requires less cost than the conventional art.

The aforementioned objects of the present invention can also be achieved by a method for producing a molded plastic product, comprising the steps of:

forming molten plastic into a plate having a hollow space and an open end of a predetermined size;

feeding a shielding part from the open end;

introducing, in a die having a cavity of a predetermined configuration, a compressed air into the hollow space so as to form a molded plastic part which accommodates the shielding part and has a hollow cross section.

The advantage of the above-described method is the production of a plastic molded part which has a shielding part is easy and requires less cost than the conventional art.

The present invention also provides an apparatus for producing a molded plastic product comprising:

assembling means for forming a molded member by sandwiching a shielding part between two plastic sheets;

heating means for heating the molded member so as to soften the plastic sheets; and molding means for introducing, in a die having a cavity of a predetermined configuration, a compressed air into the molded member so as to form a molded plastic part which accommodates the shielding part and has a hollow cross section.

The present invention further provides an apparatus for producing a molded plastic product comprising:

plastic feeding means for feeding molten plastic formed into a plate which has a hollow space and an open end of a predetermined size;

conductive body feeding means for feeding a shielding part from the open end; and molding means for introducing, in a die having a cavity of a predetermined configuration, a compressed air into the hollow space so as to form a molded plastic part which accommodates the shielding part and has a hollow cross section.

BRIEF DESCRIPTION OF THE DRAWINGS

Other objects and further features of the present invention will be apparent from the following detailed description when read in conjunction with the accompanying drawings, in which:

FIGS. 15A, 15B and 15C illustrate a construction of an eighth embodiment;

DESCRIPTION OF THE PREFERRED EMBODIMENTS

Figure 1A:
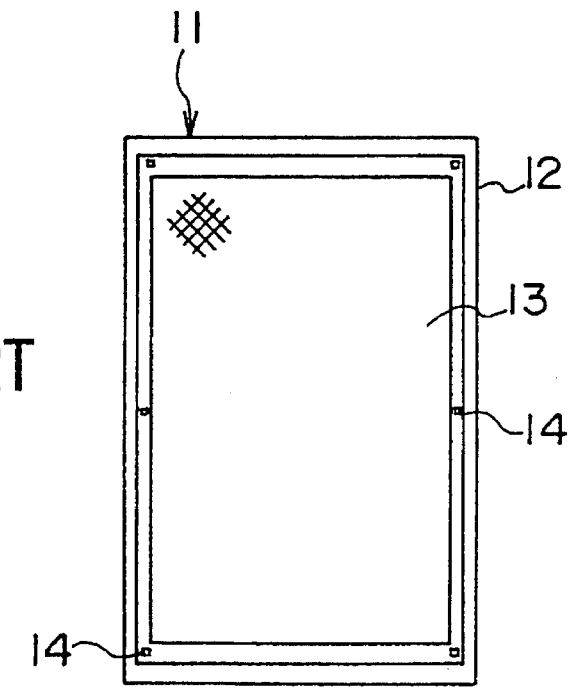
FIGS. 1A and 1B are diagrams which explain conventional covers having a shielding capability.
Figure 1B:
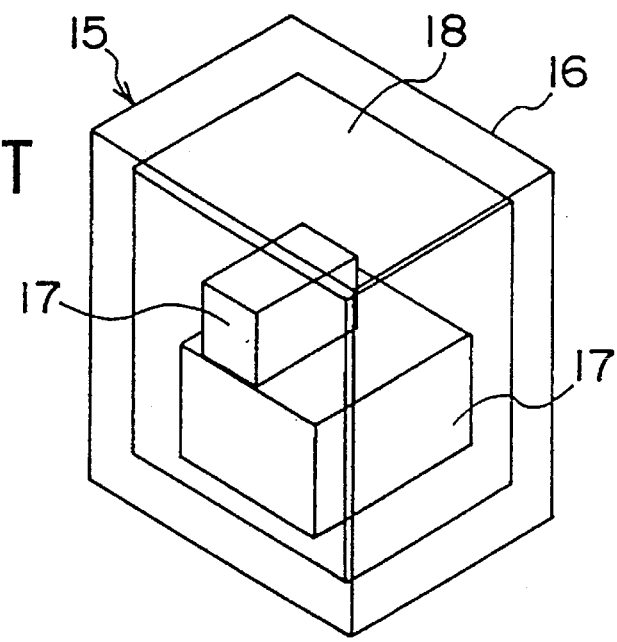
Figure 2B:
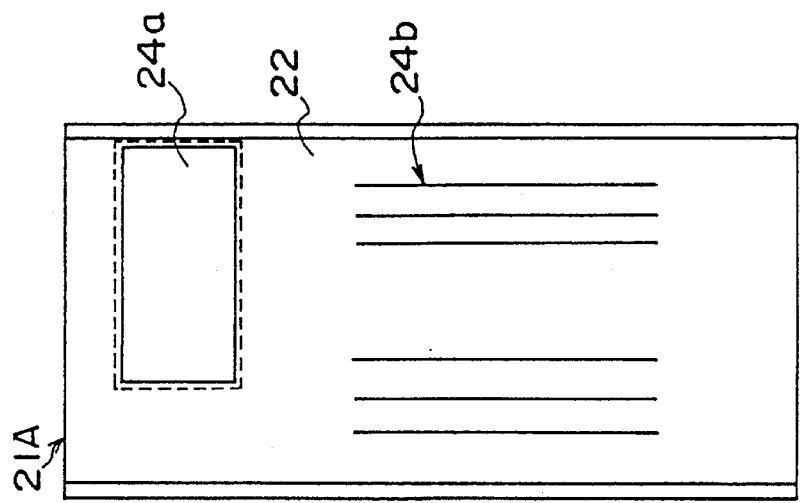
FIGS. 2A, 2B and 2C illustrate a construction of a first embodiment of the present invention.
Figure 2A:
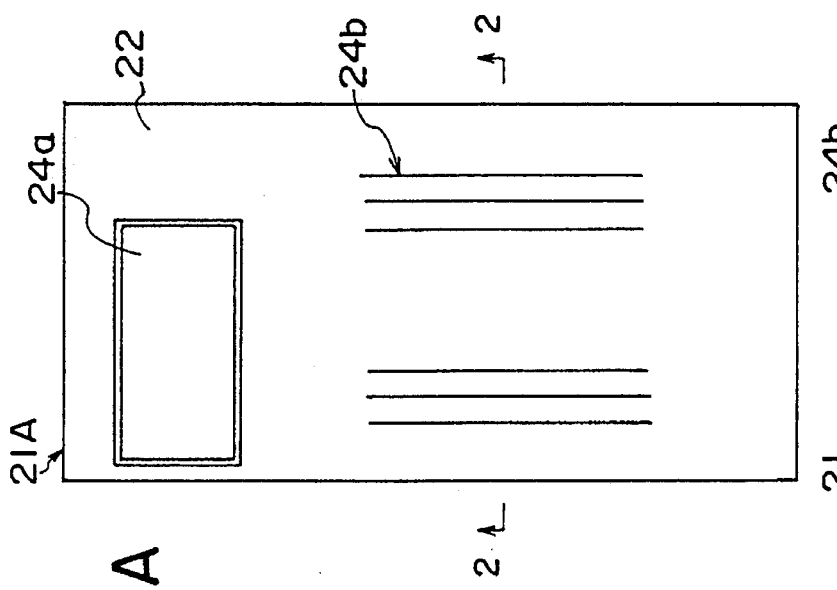
Figure 2C:
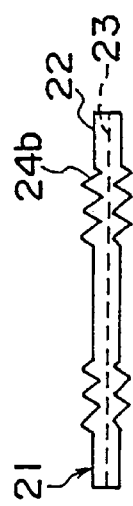

FIGS. 2A, 2B and 2C show a construction of a first embodiment of the present invention. FIGS. 2A, 2B and 2C show a molded plastic cover unit $21_A$ used at the front of a large information processing unit or the like, FIG. 2A being a rear view, FIG. 2B being a front view, and FIG. 2C being a cross sectional view taken along the line A—A of FIG. 2A.

The cover unit $21_A$ shown in FIGS. 2A–2C comprises a hollow molded plastic cover 22, and a conductive body 23 (shielding part) provided on the entirety of the interior (hollow area) of the cover 22 (see the description later for details). The cover 22 is provided with an opening 24a and a corrugated part 24b as the case may be.

Figure 3:
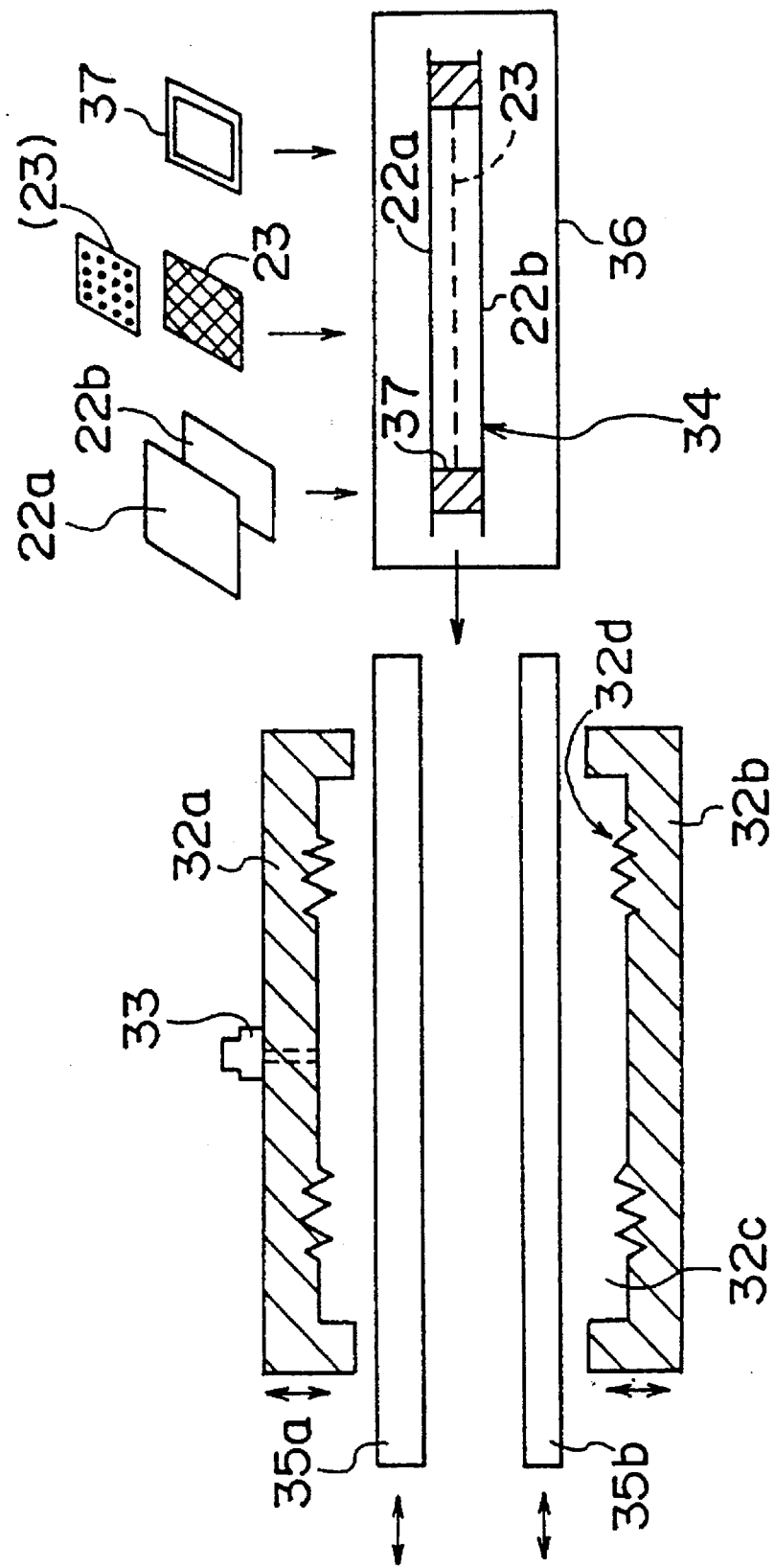
FIG. 3 illustrates a concept behind the production of the coverlet of FIGS. 2A, 2B and 2C.

FIG. 3 shows a concept behind the production of the cover unit of FIGS. 2A, 2B and 2C. A molding apparatus $31_A$ shown in FIG. 3 is an apparatus for producing the cover unit $21_A$ of FIGS. 2A, 2B and 2C. The molding apparatus $31_A$ has, as a molding means, a die 32 constituted of a movable upper die 32a and a movable lower die 32b that are opposite each other. An air outlet 33 (through which an air injection part is inserted enters) is formed on the upper die 32a. A cavity 32c corresponding to an outline of the cover is formed by the upper die 32a and the lower die 32b. A corrugated part 32d may be formed in the die 32.

Movable heater blocks 35a and 35b (heating means) are provided between the upper die 32a and the lower die 32b at an interval large enough to sandwich a molded member 34.

An assembling and feeding part 36 for assembling the molded member 34 and feeding the molded member 34 into a space between the heater blocks 35a and 35b is also provided. The assembling and feeding part 36 builds the molded member 34 by holding together two plastic sheets 22a and 22b and the conductive body 23 using a frame-like spacer 37.

The sheets 22a and 22b may be formed of a polyacetal plastic, polystyrene, polycarbonate, acryl, polyethylene, polypropylene, vinyl chloride plastic, ABS plastic or any other material that can be used in a twin composite method described later. The allowable thickness of the material depends on the degree of softening in a preheating process described later, but may be 8 mm at the maximum.

The conductive body 23 is provided for the purpose of electromagnetic shielding and produced by forming a conductive material into a thin plate. The conductive body 23 is formed to be permeable to air so that a compressive force of a gas supplied at the time of molding (described later) is supplied to both sides of the thin plate. For example, the following materials are used to form the conductive body 23; wires made of a copper, aluminum or Monel (an alloy mainly composed of nickel and copper) woven into a wire netting, nonwoven fabric like an expanded metal, or a metal plate member having a large number of vents provided therein.

The conductive member 23 may be formed of materials other than a metal as long as the material used has conductivity. A conductive plastic having metal powders or metal filler mixed therein and having a large number of vents, or a conductive rubber may be used.

Rigidity of the conductive body 23 is adjusted in consideration of whether the conductive body 23 is deformed after the molding. If the cover unit 21 having so a complicated cross section that the conductive body 23 is deformed after molding is to be produced, a soft material is used to form the conductive body 23 so that the conductive body can conform to the outline easily. This consideration is applied to a determination of a thickness of the conductive body plate (in case a metal plate is used to form the conductive plate) or of a diameter of wires (in case the wires are formed into a wire netting).

In case the conductive body 23 is formed into a plate, the periphery of the conductive body 23 must be worked into strips separated from each other, or must be worked so as to be porous, so that the sheets 22a and 22b are not prevented by the thin plate (the conductive body 23) from being fused to be integral with each other.

Figure 4A:
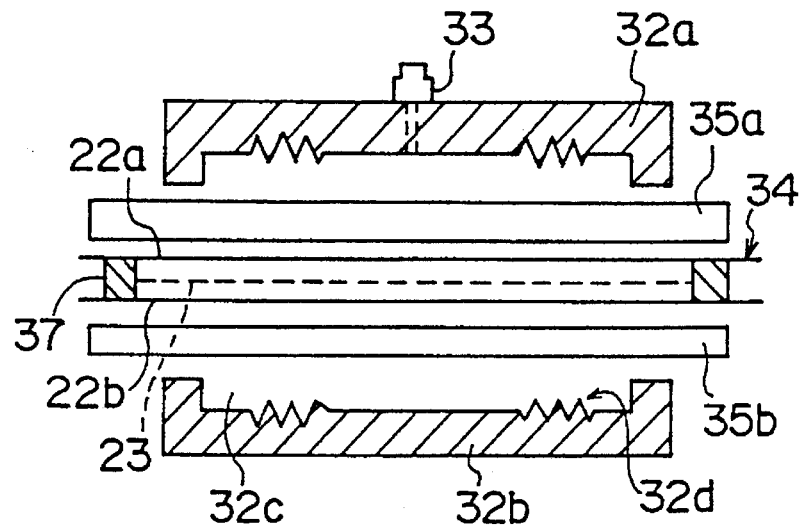
FIGS. 4A–4D illustrate a method for producing the cover unit of the first embodiment.

FIGS. 4A, 4B, 4C and 4D show how the cover unit $21_A$ of the first embodiment is produced. Referring to FIG. 4A, the assembling and feeding part 36 holds two the two sheets 22a and 22b, the conductive body 23 being sandwiched between the sheets 22a and 22b. The spacer 37 is fitted to the periphery of the sheets 22a and 22b to make sure that the interior of the molded member 34 is hermetically sealed, and the molded member 34 is transported to a space between the heater blocks 35a and 35b, and held therein.

Figure 4B:
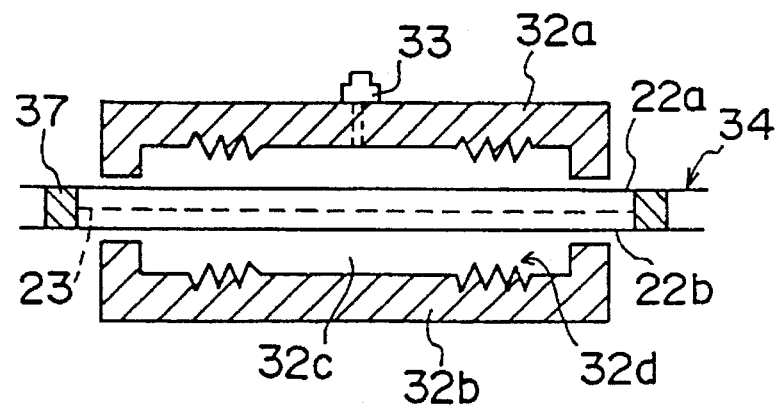

When the molded member 34 has been preheated by the heater blocks 35a and 35b and softened, the heater blocks 35a and 35b are made to recede as shown in FIG. 4B, and the upper die 32a and the lower die 32b are moved to approach each other. In this state, the temperature of the sheets 22a and 22b is, for example, 160°–170° C. (in case the molded member 34 is heated for six minutes).

Figure 4C:
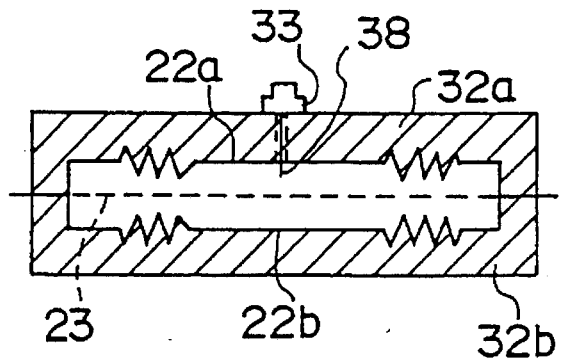

Subsequently, as shown in FIG. 4C, the upper die 32a and the lower die 32b are brought into contact with each other so as to create the cavity 32c. An air injection part 38 such as a hollow needle is injected in the softened sheet 22a from the air outlet 33 so as to force compressed air into the molded member 34. Die clamping is conducted in a pressure of 25–50 kgf/cm$^2$.

The preheated and softened sheets 22a and 22b are thrust against the inner wall of the die 32, that is the wall of the cavity 32c, by a pressure (for example, 3.5 kgf/cm$^2$ (225 seconds)) built up in the cavity 32c, with the result that the sheets 22a and 22b bulge toward the cavity 32c. The sheets 22a and 22b are fused to be integral with each other at the periphery thereof clamped by the die 32.

Figure 4D:
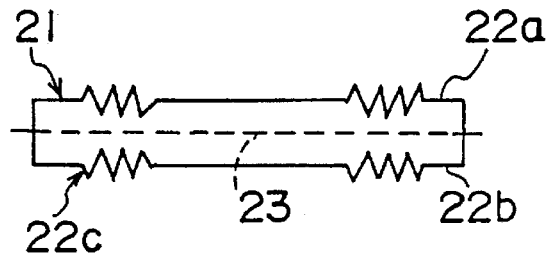

As shown in FIG. 4D, a molded hollow body thus formed has an outer configuration matching the outline of the cavity 32c, and holds the conductive body 23 in the cross-sectional center. The cover unit $21_A$ is obtained by removing the molded body from the die 32 and trimming the unnecessary edge parts thereof.

The molding apparatus $31_A$ shown in FIGS. 4A–4D is constituted such that the cover unit $21_A$ is formed by applying a twin composite method whereby the hollow body is produced from the two plastic sheets 22a and 22b. The hollow body may also be formed by a blow molding method.

FIGS. 5A–5E show another method for producing the cover unit of the first embodiment. FIGS. 5A–5E show production processes effected by a molding apparatus $31_B$ adapted for blow molding. The molding apparatus $31_B$ comprises the die 32 (molding means) composed of the upper die 32a and the lower die 32b, a die 43 (plastic feeding means) which has a parison (plastic) feeding nozzle 41 and an air nozzle 42, a feeding part 44 (conductive body feeding means) for feeding the conductive body 23. An air vent 46a and a cooling aperture 46b are formed in the upper die 32a and the lower die 32b.

Figure 5A:
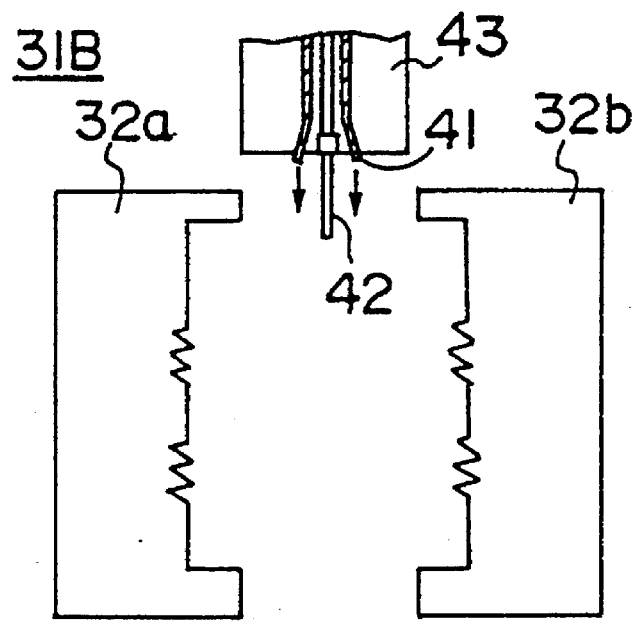
FIGS. 5A–5E illustrate another method for producing the cover unit of the first embodiment.

Referring to FIG. 5A, molten plastic (the same material as that of the sheets 22a and 22b) is fed by the parison feeding nozzle 41 of the die 43 so as to spread between the upper die 32a and the lower die 32b. The parison feeding nozzle 41 in the die 43 is annular in shape and the dimensions thereof match the size of a molded object. The parison feeding nozzle 41 thrusts the molten plastic (parison) at a predetermined pressure from a thrusting part (not shown).

Figure 5B:
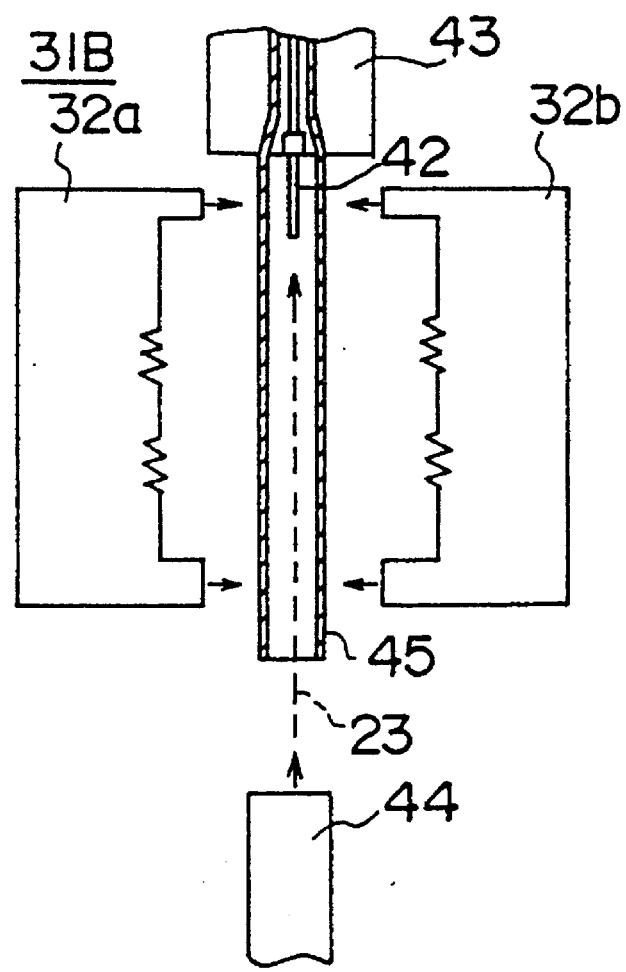

When the parison 45 thrust by the die 43 hangs slightly lower than the lower end of the die 32, as shown in FIG. 5B, the conductive body 23 is fed from the feeding part 44 into the interior of the parison 45, whereupon the die clamping by the upper die 32a and the lower die 32b is effected. Alternatively, the conductive body 23 is fed first from the feeding part 44, and then the parison 45 is fed so as to cover the conductive body 23.

Figure 5C:
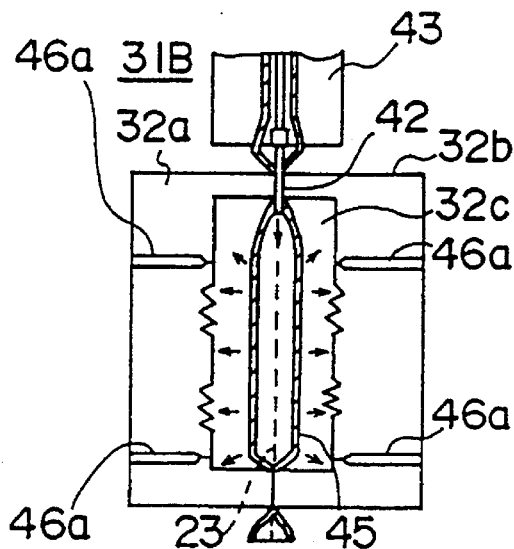
Figure 5D:
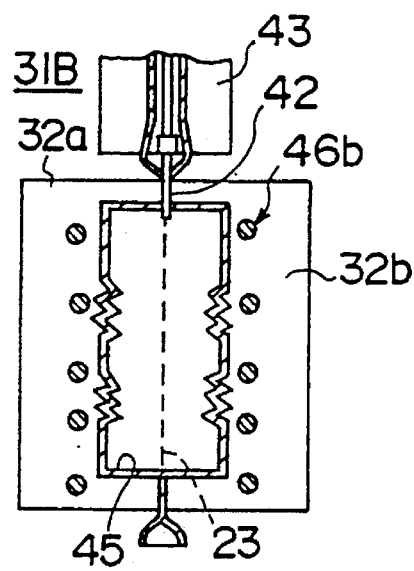
Figure 5E:
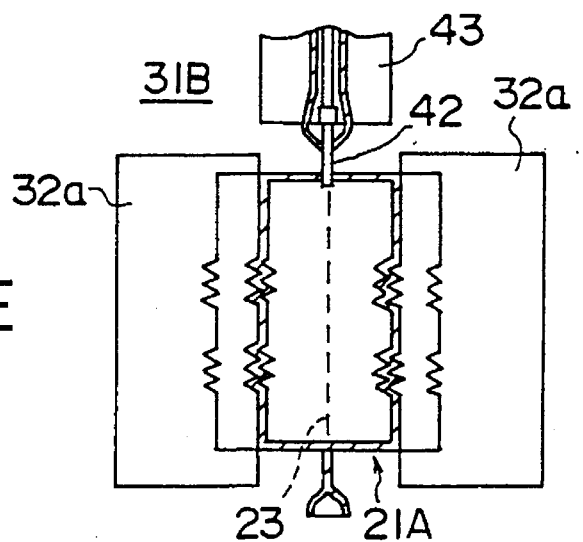

As shown in FIG. 5C, when the die clamping is completed, a compressed air is injected from the air nozzle 42 so as to cause the parison 45 to swell. The air inside the cavity 32c is ejected from the air vent 46a.

As a result of air injection by the air nozzle 42, the parison 45 is caused to be firmly in contact with the wall of the cavity 32c, as shown in FIG. 4D. The parison 45 is then hardened by feeding a coolant via the cooling aperture 46b.

As shown in FIG. 4E, the cover unit $21_A$ is formed by separating the upper die 32a and the lower die 32b from each other, removing the air nozzle 42, and trimming the unnecessary edge parts.

The blow molding described above is different from the twin composite method shown in FIGS. 4A–4D in that it is not necessary to form the sheets 22a and 22b and the molded member 34. Therefore, the number of steps in production as well as the production time is reduced. The blow molding method may be applied not only to the first embodiment but also to the other embodiments described below.

In the following embodiments, those parts that are the same as the parts of the first embodiment are designated by the same reference numerals, and the descriptions thereof are omitted.

FIGS. 6A–6D show steps of producing the cover unit of a second embodiment of the present invention. The die 32 (the corrugated part 32d is omitted) shown in FIGS. 6A–6C and the heater blocks 35a and 35b are the same as the corresponding parts of the first embodiment. The assembling and feeding part 36 is omitted.

In the molding apparatus $31_A$, the molded member 34 transported into a space between the heater blocks 35a and 35b and held therein is prepared such that the assembling and feeding part 36 temporarily hold the conductive body 23 between the two sheets 22a and 22b by applying adhesives 47 (adhesive member) at predetermined positions of the conductive body 23. The adhesives are hardened when the sheets 22a and 22b are preheated. Epoxy adhesives or phenol adhesives are used as the adhesives 47.

The adhesives are hardened when the sheets 22a and 22b are softened by the heat applied from the heater blocks 35a and 35b so that the conductive body 23 is fixed to, for example, the sheet 22b.

Figure 6A:
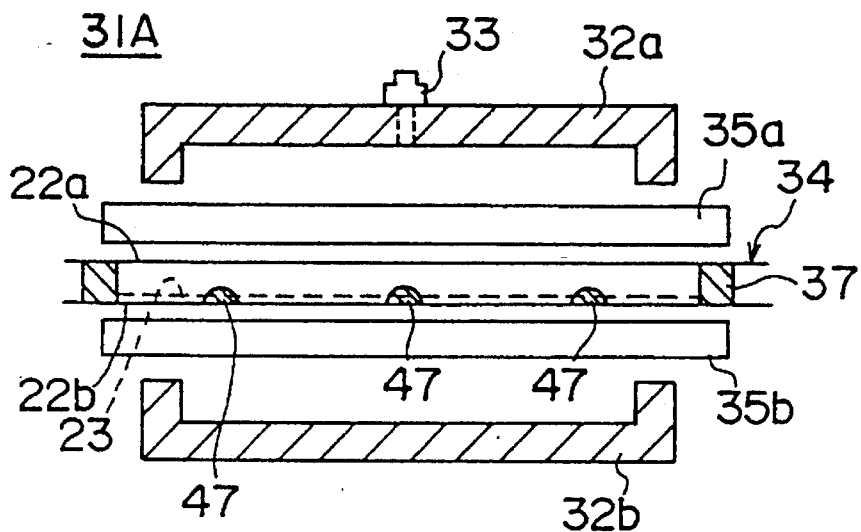
FIGS. 6A–6D illustrate method for producing the cover unit of a second embodiment.
Figure 6B:
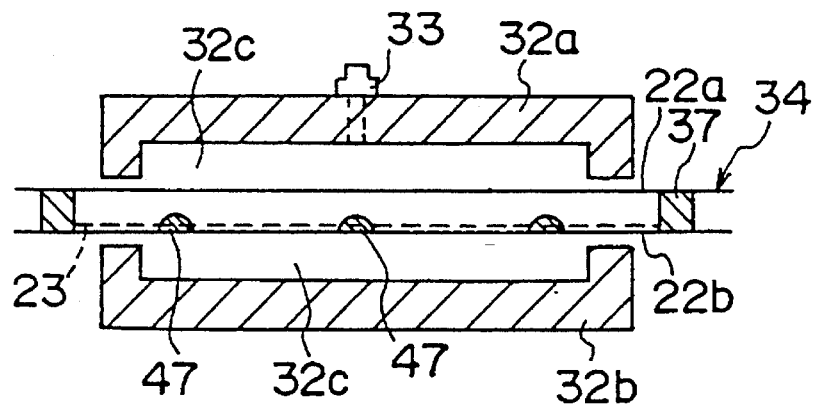
Figure 6C:
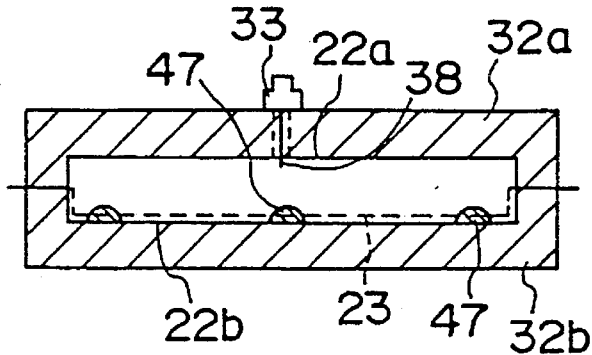

When the sheets 22a and 22b are softened, the heater blocks 35a and 35b are made to recede so that, as shown in FIG. 6B, the sheet 22a is brought into contact with the upper die 32a, and the sheet 22b is brought into contact with the lower die 32b. Thereafter, as shown in FIG. 6C, the air injection part 38 injects a compressed air into the molded member 34 so that the heated and softened sheets 22a and 22b are thrust against the wall of the cavity 32c.

Figure 6D:
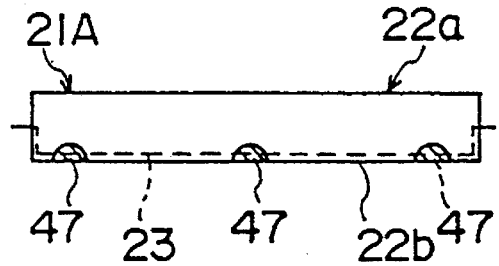

As shown in FIG. 6D, the hollow cover unit $21_A$ is obtained after a cooling of the sheets 22a and 22b. The conductive body 23 is prevented from becoming loose in the molded member 34 by being fixed to the inner wall of the cover $21_A$ by the adhesives 47.

Since it is assumed that the conductive body 23 is deformed in molding, it is desirable that the conductive body 23 is flexible. For example, fine metal wires woven into a netting, or a flexible conductive plastic sheet may be used to form the conductive body 23.

In the second embodiment described above, the conductive body 23 is joined to one of the sheets 22a and 22b in the preheating process, and the sheet 22a is then deformed. Therefore, it is necessary for the conductive body 23 not to provide resistance when the sheet 22a is deformed. Accordingly, it is desirable that a soft material be used to form the conductive body 23, areas applied with the thermosetting adhesives 47 be minimized while intervals between the areas applied with the adhesives 47 be great.

The cover body 21, constructed such that the conductive body 23 is provided in the cover 22, has electromagnetic shielding capability and may be employed in large information processing units described later. The production methods described above, in which method the cover 22 and the conductive body 23 are formed at the same time, is easy to perform and requires small cost. Also, recycling is easy, and this further reduces the cost.

Figure 7A:
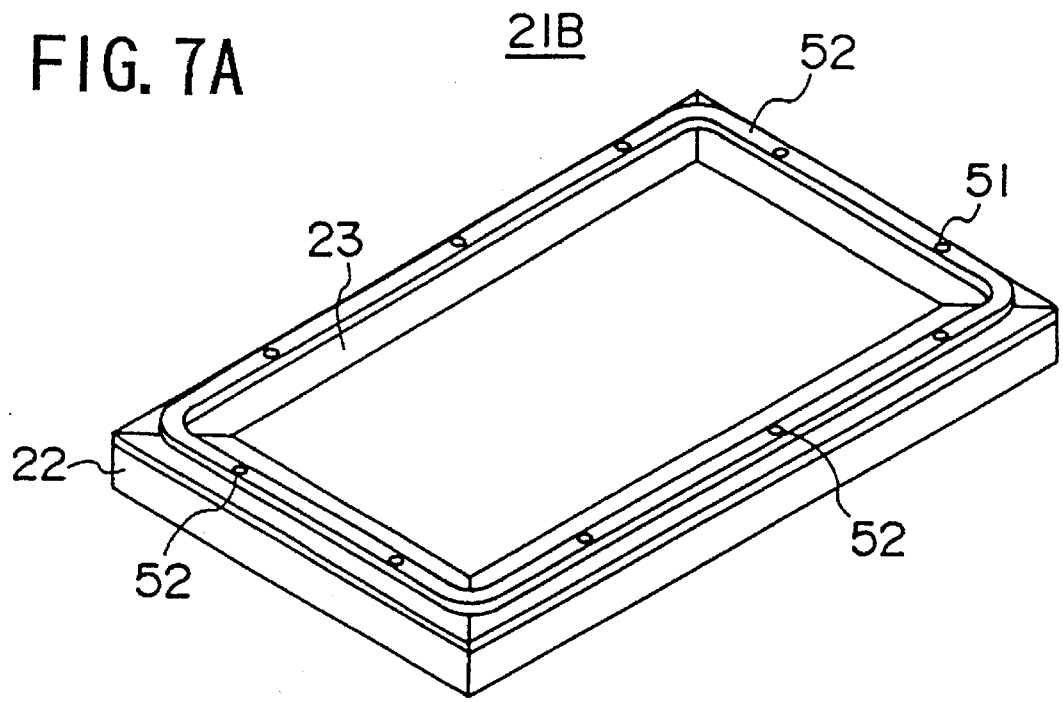
FIGS. 7A and 7B illustrate a construction of the second embodiment.
Figure 7B:
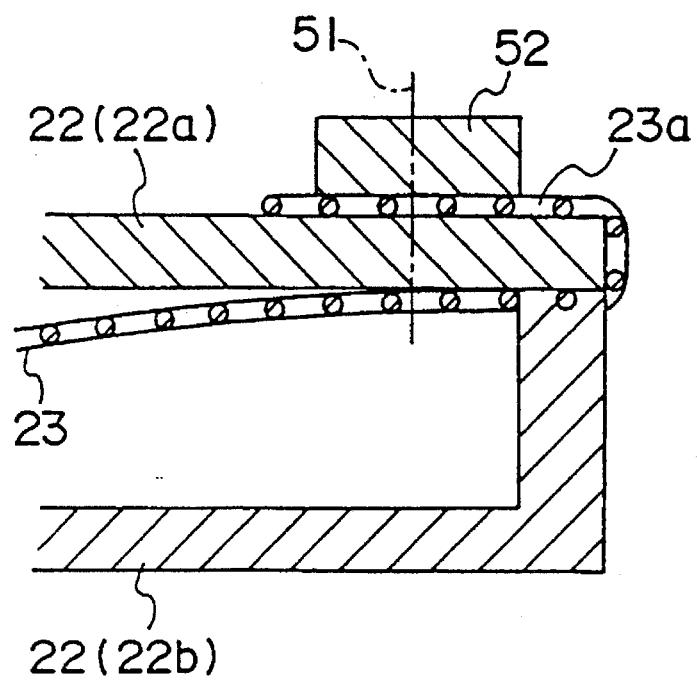

FIGS. 7A and 7B show a construction of a third embodiment. FIG. 7A is a schematic view, and FIG. 7B is a partial cross sectional view. A hollow cover unit $21_B$ shown in FIGS. 7A and 7B is formed by the plastic sheets 22a and 22b (hereinafter, sometimes referred to as an upper cover 22a and a lower cover 22b). The cover unit $21_B$ comprises: the cover 22 which holds, in the hollow area thereof, the conductive body 23 formed into a wire netting; and a conductive packing 52 (conductive member) fixed by a stopper 51 to the periphery of the surface of the upper cover 22a.

The conductive packing 52 may be formed of various rubber or urethane materials having flexibility and resiliency, these materials including a conductive plastic, conductive rubber, or plastic having a conductive paint applied on the surface. The conductive packing 52 is fitted to the entirety of the periphery of the upper cover 22a.

The conductive body 23 formed into a sheet has a lead part 23a that goes out from the portion at which the upper and lower covers 22a and 22b are joined. The lead part 23a is guided along the side of the upper cover 22a so as to be sandwiched between the conductive packing 52 and the upper cover 22a. The stopper 51 clamps the lead part 23a to the upper cover 22a together with the conductive packing 52.

Figure 8:
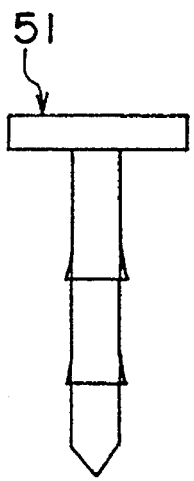
FIG. 8 is a front view of the stopper of FIGS. 7A and 7B.

FIG. 8 shows a plan view of the stopper of FIG. 7. The stopper 51 shown in FIG. 8 is a rivet formed of a conductive metal or the like. The stopper 51 penetrates the conductive packing 52, the lead part 23a of the conductive body 23, the upper cover 22a and the conductive body 23 so that the conductive packing 52 and the lead part 23a are fixed to each other and electrical connection is established.

Figure 9:
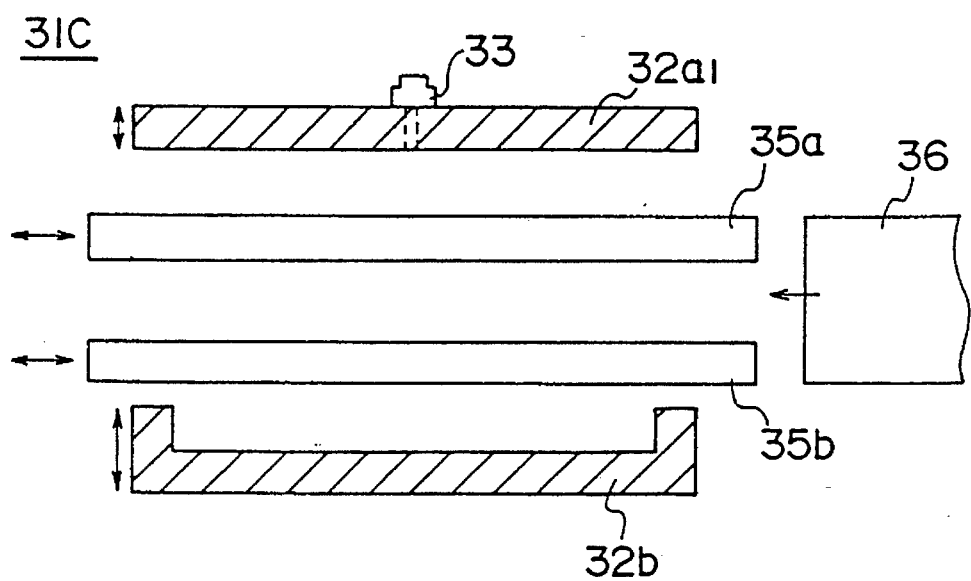
FIG. 9 is a schematic view of the apparatus for producing the cover unit of FIGS. 7A and 7B.

FIG. 9 is a schematic view of a molding apparatus for producing the cover $21_B$ of FIG. 7. A molding apparatus $31_C$ shown in FIG. 9 differs from the molding apparatus $31_A$ of FIGS. 3 and FIG. 6A in that an upper die $32a_1$ constituting the die 23 is flat, the other aspects of the construction being the same. By using this construction, the molded member 34 is formed in the assembling and feeding part 36 such that the conductive body 23 encased, as in the case of the first and second embodiments, by the two sheets 22a, 22b and the spacer 37 is provided nearer the upper die $32a_1$ (that is, nearer the sheet 22a).

Figure 10A:
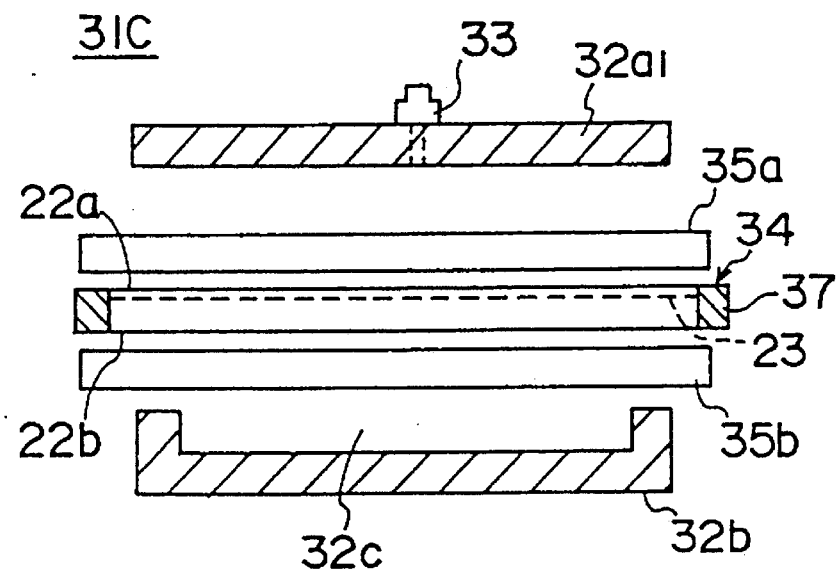
FIGS. 10A–10D illustrate a method for producing the cover unit of a third embodiment.

FIGS. 10A–10D show a method for producing the cover unit of the third embodiment. Referring to FIG. 10A, the assembling and feeding part 36 (not shown in FIGS. 10A–10D) transports the molded member 34 to a space between the heater blocks 35a and 35b and settles the molded member 34 therein. The molded member 34 is disposed such that the conductive body 23 is nearer the sheet 22a than the sheet 22b. Since the spacer 37 is disposed outside the die 32, the spacer 37 prevents air from escaping the periphery of the die 32.

Figure 10B:
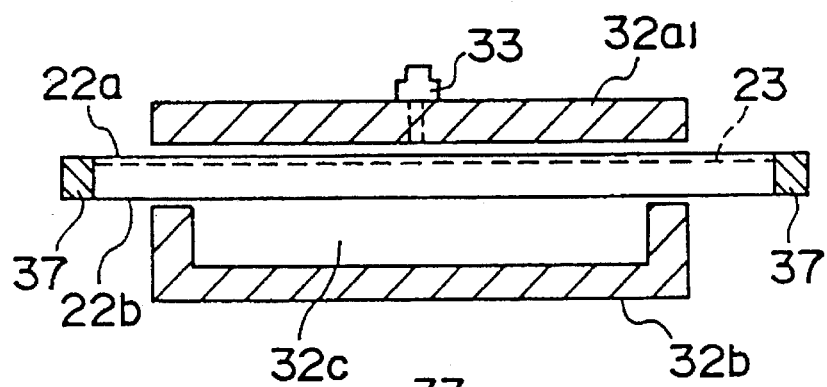

As shown in FIG. 10B, the molded member 34 is preheated by the heater blocks 35a and 35b (for example, to 160°–170° C.). When the molded member 34 is softened, the heater blocks 35a and 35b are made to recede, whereupon the upper die 32a and the lower die 32b are moved to come into contact with each other.

Figure 10C:
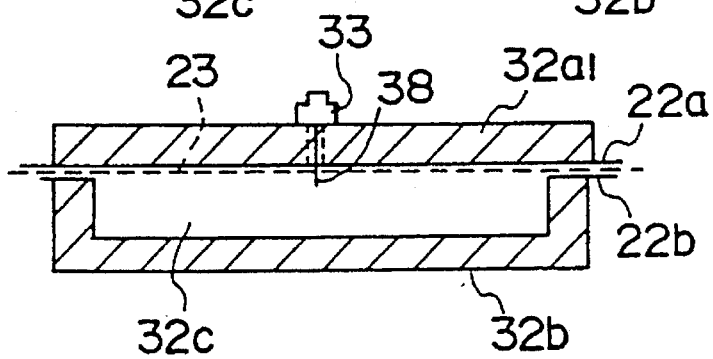
Figure 10D:
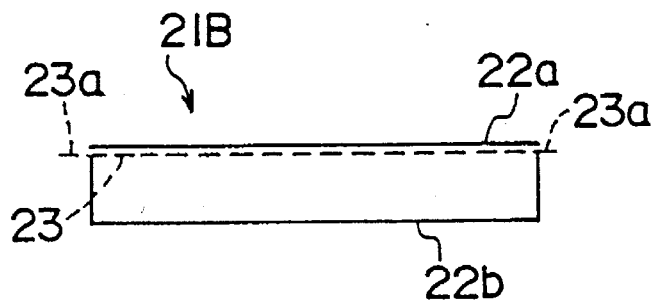

As shown in FIG. 10C, the cavity 32c is formed between the upper die 32a and the lower die 32b which are brought into contact with each other. The air injection part 38 formed of a hollow needle or the like is injected from the air outlet 33 into the softened sheet 22a so that a compressed air is forced into the molded member 34. Clamping is done in a pressure 25–50 kgf/cm².

The sheets 22a and 22b which are heated and softened by preheating are thrust against the wall of the die 32 by an internal pressure (for example, 3.5 kgf/cm² (225 seconds)) and is caused to swell toward the cavity 32c. The two sheets 22a and 22b become inseparable from each other, the periphery of the two sheets being fused with each other due to the clamping action of the die 32.

The cover $21_B$ thus formed has an outer appearance that matches the outline of the cavity 32c and has a hollow cross section, the conductive body 23 being disposed nearer the upper end of the cross section. After the cover $21_B$ is removed from the die 32, the unnecessary edge parts are trimmed. This trimming process is conducted such that a predetermined length of the conductive body 23 is made to remain at the periphery. The remaining part is the lead part 23a.

When the cover $21_B$ is used as a cover of a large information processing unit described later, electromagnetic shielding effect may be improved by allowing the frame of the unit body to contact the conductive packing 52, thereby establishing electrical connection between the frame of the unit body and the conductive body 23. The third embodiment makes it possible to produce the cover unit $21_B$ adapted for such an application easily and at a low cost.

Figure 11:
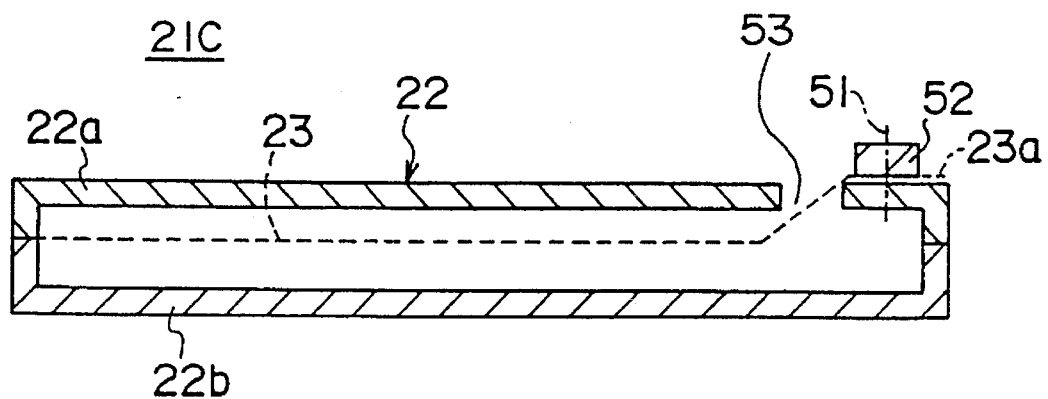
FIG. 11 illustrate a construction of a fourth embodiment.

FIG. 11 shows a construction of a fourth embodiment of the present invention. A cover unit $21_C$ shown in FIG. 11 is constructed such that the upper cover 22a and the lower cover 22b form the box-like hollow cover 22, and a lead aperture 53 is formed at a predetermined position of the upper cover 22a. The conductive body 23 is guided through the lead aperture 53 onto the surface of the upper cover 22a, and clamped to the upper cover 22a together with the conductive packing 23.

Figure 12:
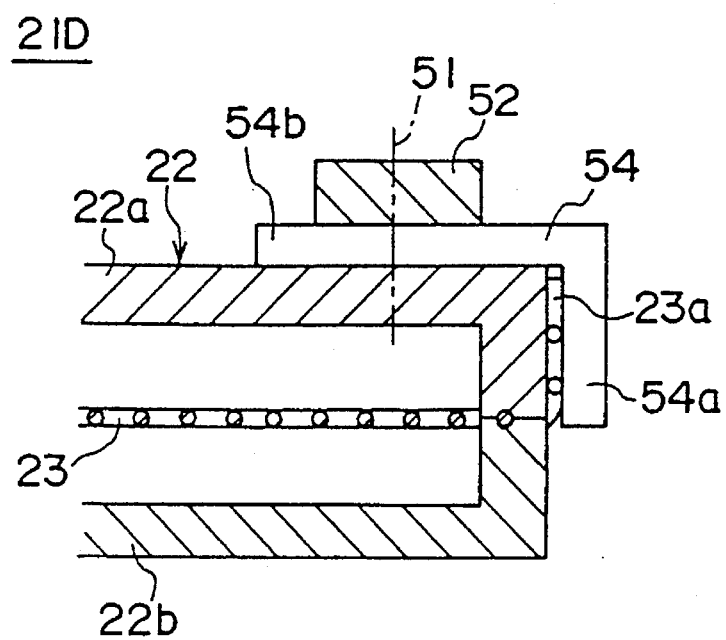
FIG. 12 illustrates a construction of a fifth embodiment.

FIG. 12 shows a construction of a fifth embodiment of the present invention. A cover unit $21_D$ shown in FIG. 12 is constructed such that the upper cover 22a is fitted, at the periphery thereof, with a metal fitting 54 (conductive connecting member) formed to have an L-shaped cross section and having a vertical piece 54a which extends on the side wall of the upper cover 22a and a horizontal piece 54b which extends on the surface of the upper cover 22a.

The metal fitting 54 is formed of a metal material such as a copper or aluminum which has a good conductivity. The metal fitting 54 is clamped to the upper cover 22a together with the conductive packing 52 held on top of the horizontal piece 54b. When fitted to the upper cover 22a, the metal fitting 54 clamps the lead part 23a, of the conductive body 23, that goes out from the junction of the upper and lower covers 22a and 22b, against the side wall of the upper cover 22a so that electrical connection is established between the conductive body 23 and the conductive packing 52.

It is also possible to establish electrical connection between the conductive body 23 and the conductive packing 52 such that a small length of the lead part 23a of the conductive body 23 is made to go out from the cover 22, conductive grease is made to fill the space formed by the lead part 23a, the metal fitting 54 and the side of the upper cover 22a, and the metal fitting 54 is fixed to the side of the upper cover 22a by a screw or the like. In this manner, it is not necessary to make a great length of the lead part 23a of the conductive body 23 go out, and the trimming becomes easy.

Figure 13A:
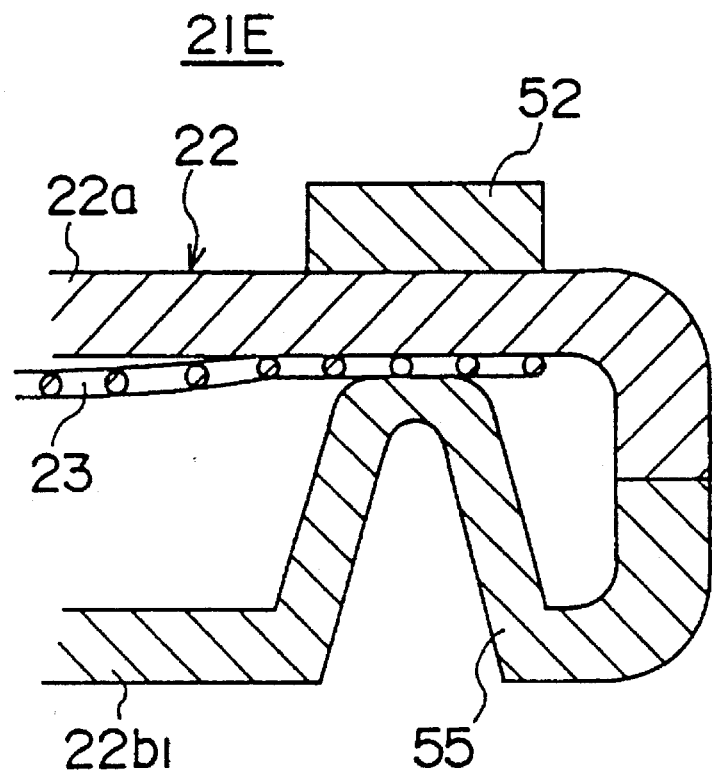
FIGS. 13A and 13B illustrate a construction of a sixth embodiment.
Figure 13B:
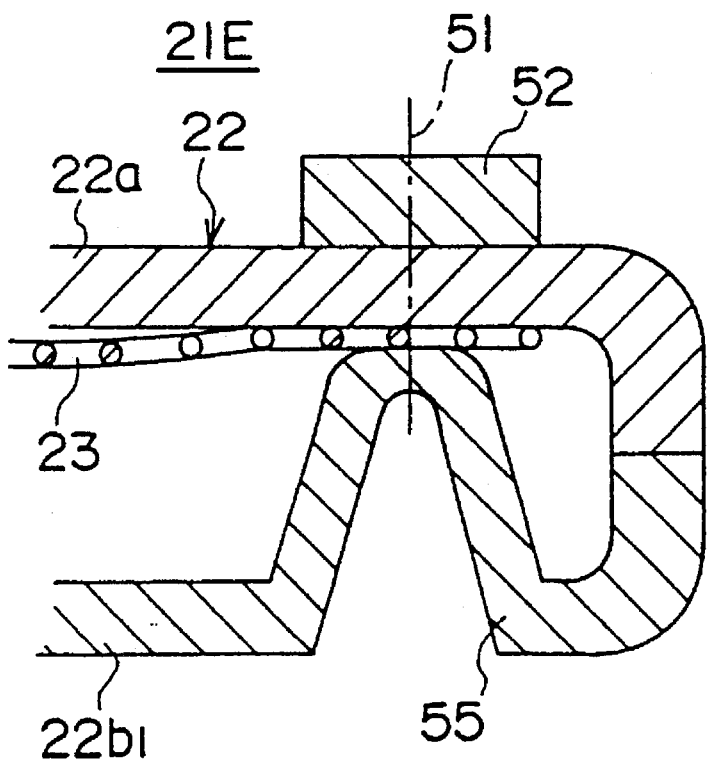

FIGS. 13A and 13B show a construction of a sixth embodiment of the present invention. A cover unit $21_E$ shown in FIG. 13A shows a variation of the cover adapted to a case in which an adhesive is used to join the conductive packing 52 to the upper cover 22a. Specifically, in this embodiment, a lower cover $22b_1$ is formed with a pressing part 55 which bulges toward the underside of the part of the upper cover 22a at which part the conductive packing 52 is adhesively attached to the upper cover 22a. The pressing part 55 presses the conductive body 23 against the underside of the upper cover 22a.

As a result, the conductive packing 52 and the conductive body 23 are close to each other. The gap for an electromagnetic wave to pass is only as thick as the upper cover 22a so that the electromagnetic shielding capability is improved.

Referring to FIG. 13B, the conductive packing 52 is fixed to the upper cover 22a by the stopper 51, as in the case of the aforementioned embodiments. Specifically, electrical connection can be firmly established between the conductive packing 52 and the conductive body 23 by screwing the stopper 51 into the pressing part 55.

The pressing part 55 can be formed by forming corresponding projections in the lower die 32b shown in FIG. 9 at predetermined intervals.

Figure 14:
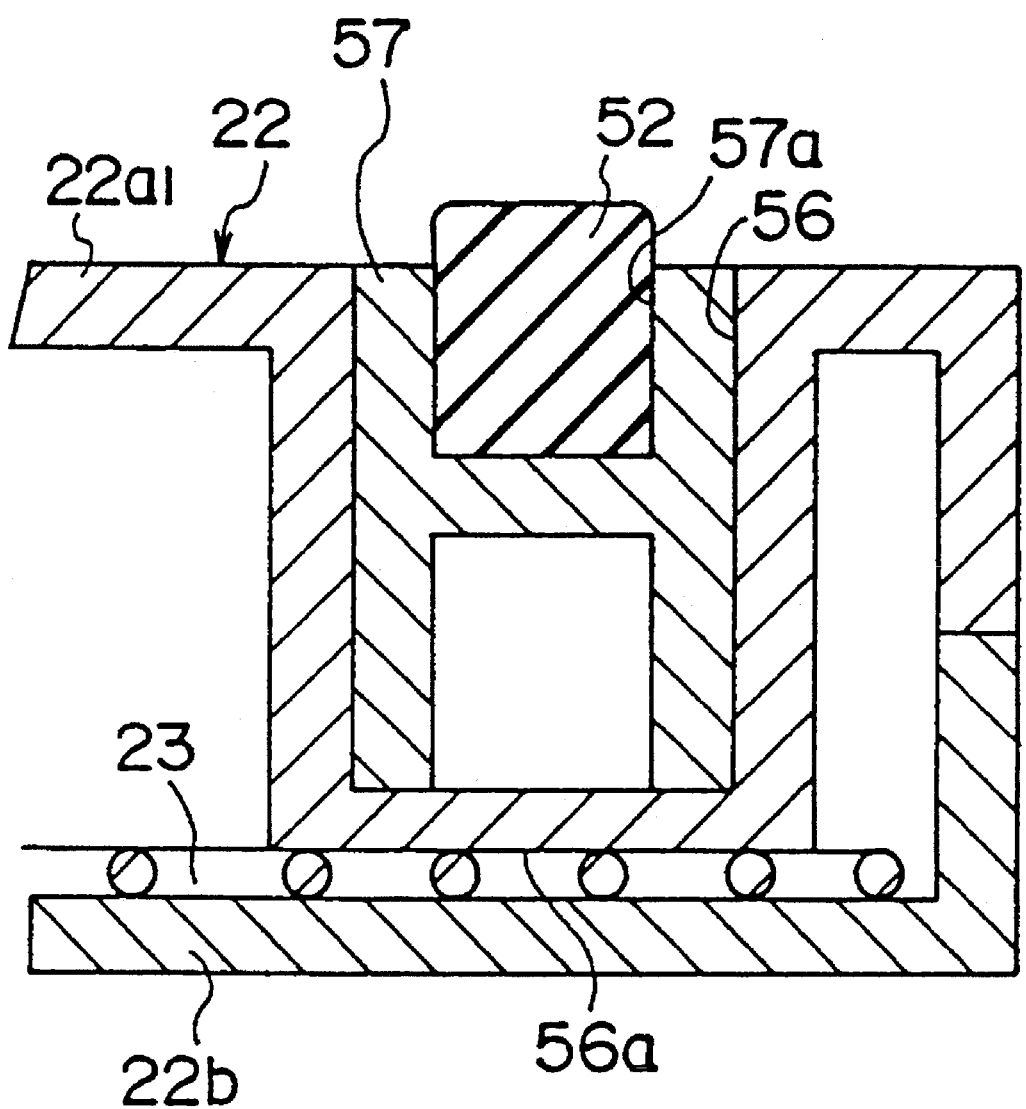
FIG. 14 illustrates a construction of a seventh embodiment.

FIG. 14 shows a construction of a seventh embodiment of the present invention. In this embodiment, a packing holding groove 56 is formed in the entirety of the periphery of the upper cover $22a_1$. A conductive material like a metal inserted member 57 is integrally formed with the packing groove 56. The inserted member 57 is formed to have an H-shaped cross section. The conductive packing 52 is press-fitted into an upper opening groove 57a of the inserted member 57 and fixed therein. A bottom wall 56a of the packing holding groove 56 is close to the lower cover 22b and presses the conductive body 23 against the lower cover 22b.

Since electrical connection is established between the conductive packing 52 and the inserted member 57, and the inserted member 57 and the conductive body 23 are close to each other, the gap for an electromagnetic wave to pass is reduced, and the electromagnetic shielding capability is improved.

FIGS. 15A, 15B and 15C show a construction of an eighth embodiment of the present invention. FIG. 15A is a rear view of a cover unit, FIG. 15B is a front view thereof, and FIG. 15C is a cross sectional view taken along the line B—B of FIG. 15A.

A cover unit $21_G$ shown in FIGS. 15A–15C includes the hollow cover 22. A packing holding groove 61 is formed by a projection 61a provided at the periphery of the back of the cover 22. The conductive body 23 is provided inside the hollow cover 22, and the periphery of the conductive body 23 extends to the packing holding groove 61 (see FIG. 20).

Figure 16A:
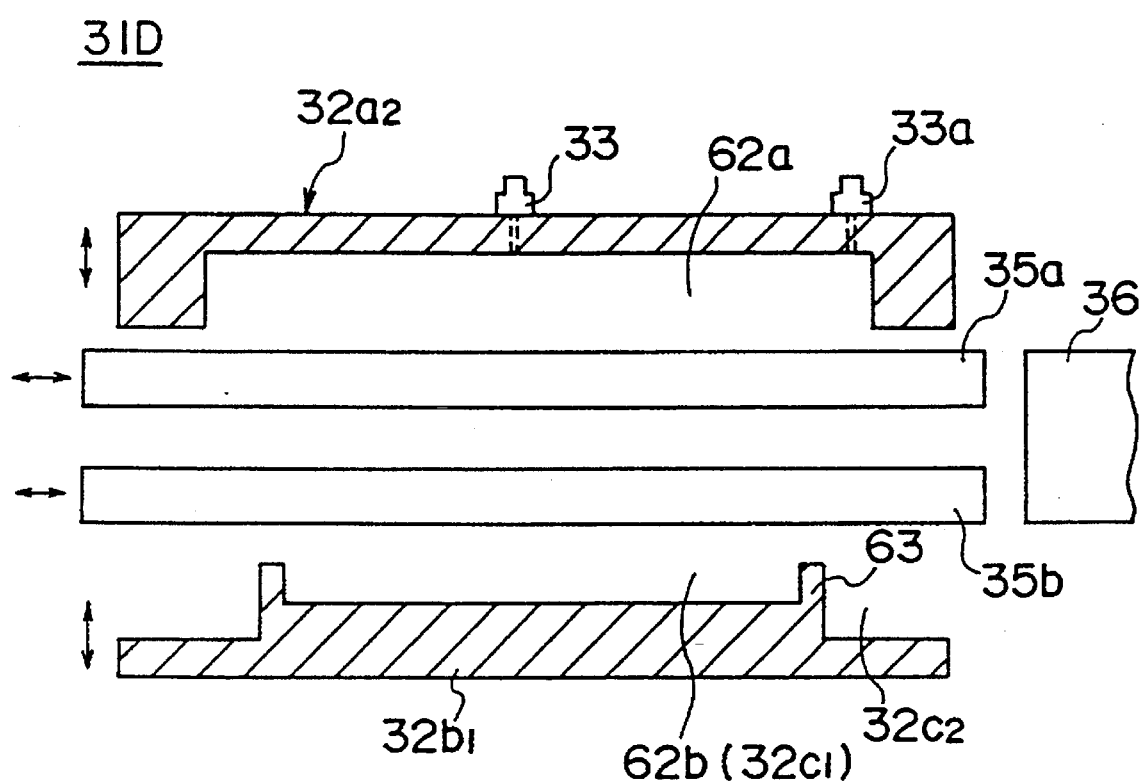
FIGS. 16A and 16B illustrate a concept behind a molding apparatus for producing the cover unit of FIGS. 15A, 15B and 15C.
Figure 16B:
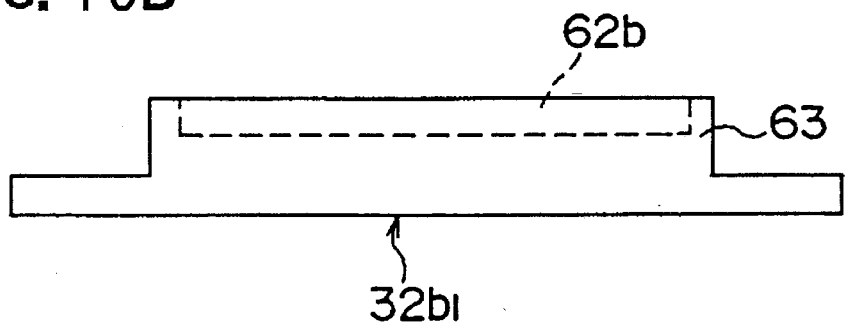

FIGS. 16A and 16B show a concept behind a molding apparatus for producing the cover unit of FIGS. 15A, 15B and 15C. FIG. 16A is a cross sectional view showing the concept, and FIG. 16B is a side view of a lower die $32b_1$. A molding apparatus $31_D$ shown in FIGS. 16A and 16B has a die 32 consisting of an upper die $32a_2$ and a lower die $32b_1$ (molding means) that are movable to approach or to be removed from each other.

A depression 62a is formed in the upper die $32a_2$, the air outlet 33 being provided at the center and an air outlet 33a being provided at the end. A depression 62b is created in a projection 63 formed in the lower die $32b_1$, the depression 62b having a flat surface smaller in area than the flat surface of the depression 62a of the upper die $32a_2$. The bottom of the depression 62b is configured to be higher in level than the periphery of the lower die $32b_1$.

When the upper die $32a_2$ and the lower die $32b_1$ are brought into contact with each other, a first cavity $32c_1$ is formed between the depression 62a and the depression 62b, and a second cavity $32c_2$ is formed between the depression 62a and the periphery of the lower die $32b_1$. The air outlet 33 is disposed in the first cavity $32c_1$, and the air outlet 33a is disposed in the second cavity $32c_2$.

The movable heater blocks 35a and 35b are disposed between the upper die $32a_2$ and the lower die $32b_1$ separated from each other. The assembling and feeding part 36 for feeding a molded member is provided between the heater blocks 35a and 35b.

Figure 17A:
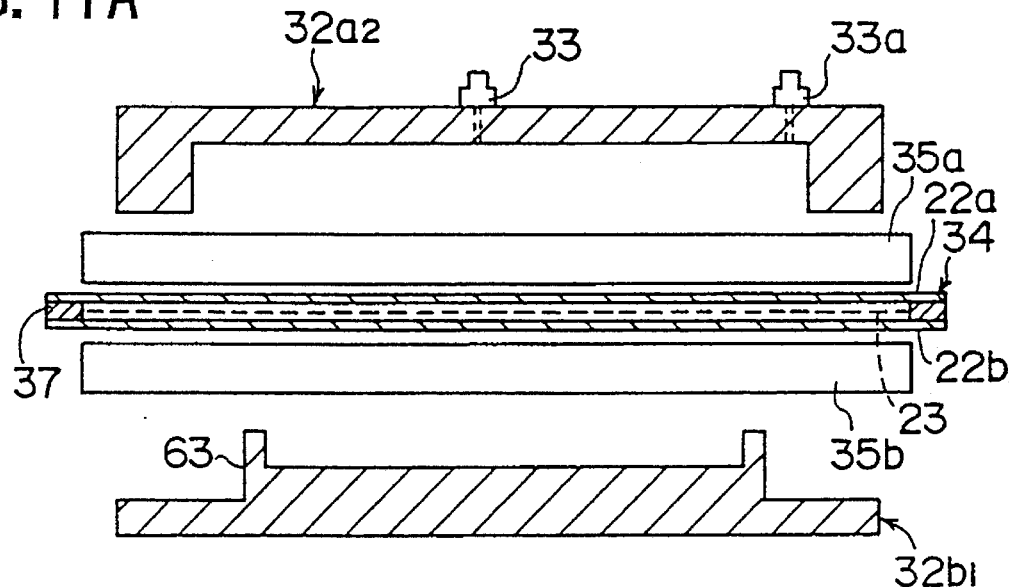
FIGS. 17A–17D illustrate a method for producing the cover unit of a eighth embodiment.

FIGS. 17A–17D show a construction of an eighth embodiment. Referring to FIG. 17A, the two sheets 22a and 22b sandwich the conductive body 23 in the assembling and feeding part 36 (not shown). The molded member 34 hermetically sealed by the spacer 37 provided at the periphery of the sheets 22a and 22b is transported to a space between the heater blocks 35a and 35b, and held therein.

When the molded member 34 is preheated by the heat applied by the heater blocks 35a and 35b, the heater blocks 35a and 35b are made to recede, and the upper die 32a and the lower die $32b_1$ are moved to approach each other. The temperature of the sheets 22a and 22b is, for example, 160°–170° C. (after six minutes of heating).

Figure 17B:
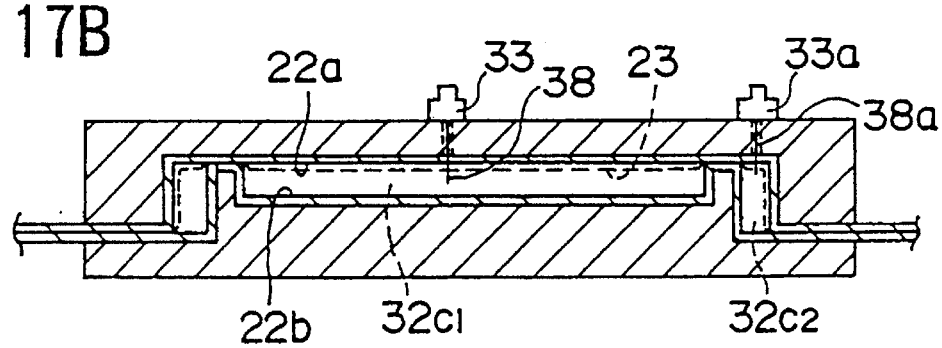

Subsequently, as shown in FIG. 17B, the upper die 32a and the lower die 32b are brought into contact with each other so that the first and second cavities $32c_1$ and $32c_2$ (first and second spaces) are formed. The air injection part 38 such as a hollow needle is injected from the air outlet 33 into the softened sheet 22a, and an air injection part 38a such as a hollow needle is injected from the air outlet 33a into the softened sheet 22a, so as to force a compressed air to be introduced into the molded member 34. Clamping is conducted in a pressure of, for example, 25–50 kgf/cm².

The sheets 22a and 22b which have been heated and softened by preheating are thrust against the wall of the die 32 by an internal pressure (for example 3.5 kgf/cm² (225 seconds)), that is, thrust against the first and second cavities $32c_1$ and $32c_2$, and are made to swell. The sheets 22a and 22b are fused to be integral with each other at the periphery of the first cavity $32c_1$ and the periphery of the second cavity $32c_2$, the peripheries being clamped by the die 32.

Figure 17C:
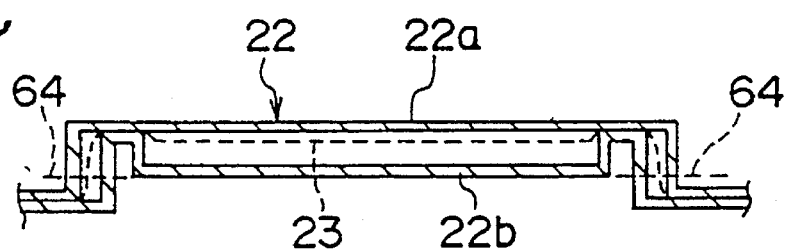
Figure 17D:
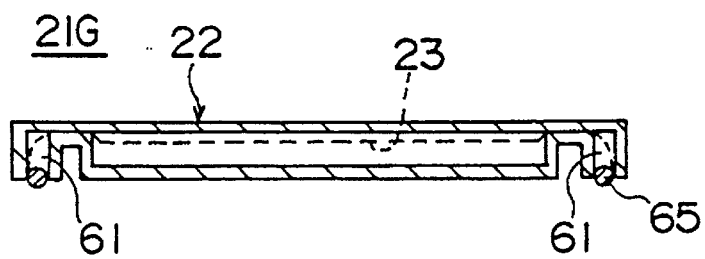

As shown in FIG. 17C, edge parts (the spacer 37 is omitted) are cut by trimming the molded member 34 at a cutting line 64. As a result, the packing holding groove 61 is formed on the back of the cover 22.

A conductive packing 65 formed of the same material as the conductive packing 52 is press-fitted into the packing holding groove 61 so as to be in contact with the conductive body 23. Thus, the production of the cover $21_G$ having a shielding structure is easy and requires small cost.

Figure 18A:
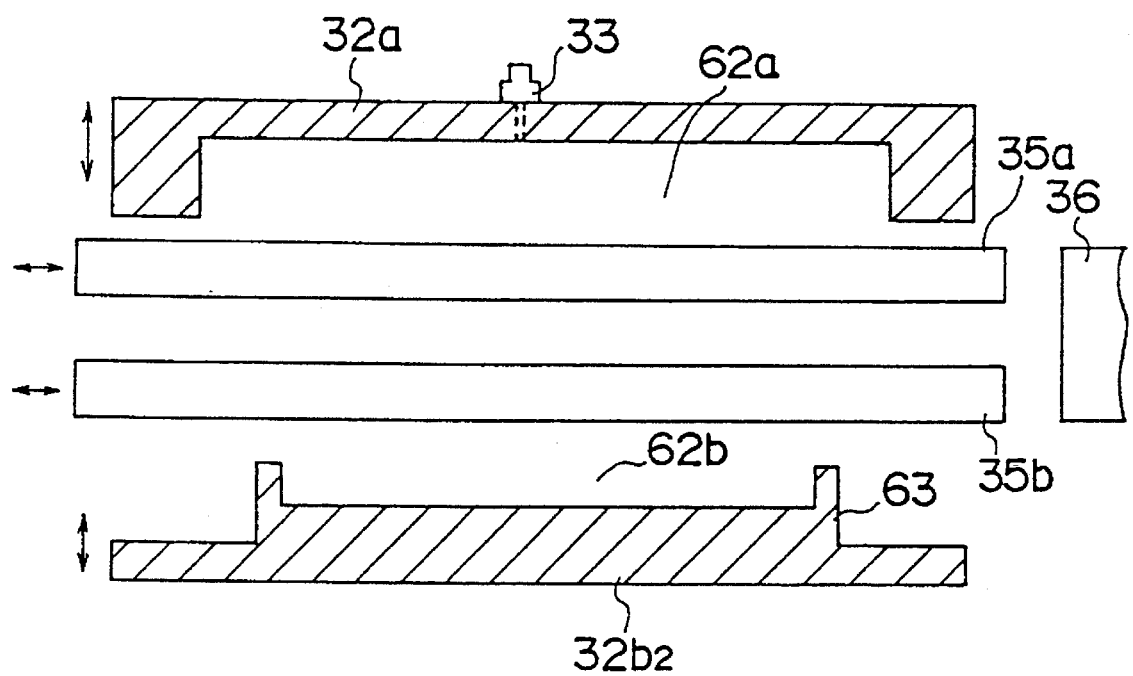
FIGS. 18A and 18B illustrate a variation of the molding apparatus for producing the cover unit of the eight embodiment.
Figure 18B:
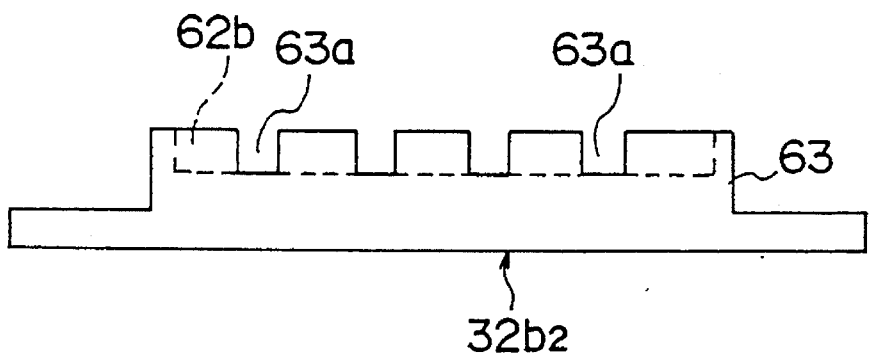

FIGS. 18A and 18B show a concept behind a variation of the molding apparatus for producing the cover unit of the eighth embodiment. FIG. 18A is a cross sectional view showing the concept, and FIG. 18B is a side view of the lower die $32b_2$. The lower die $32b_2$ of a molding apparatus $31_E$ shown in FIGS. 18A and 18B is constructed such that a predetermined number of air ventilating grooves 63a are formed in the projection 63 in which the depression 62b is formed.

Accordingly, only one cavity (the cavity 32c) is formed by the upper die 32a and the lower die 32b being brought into contact with each other, and the cavity 32c is ventilated as a whole. Unlike the upper die $32a_2$ shown in FIGS. 16A and 16B, only one air outlet 33 needs to be provided in the upper die 32a of FIG. 18A, the other aspects of the construction being the same as that of FIGS. 16A and 16B.

Figure 19A:
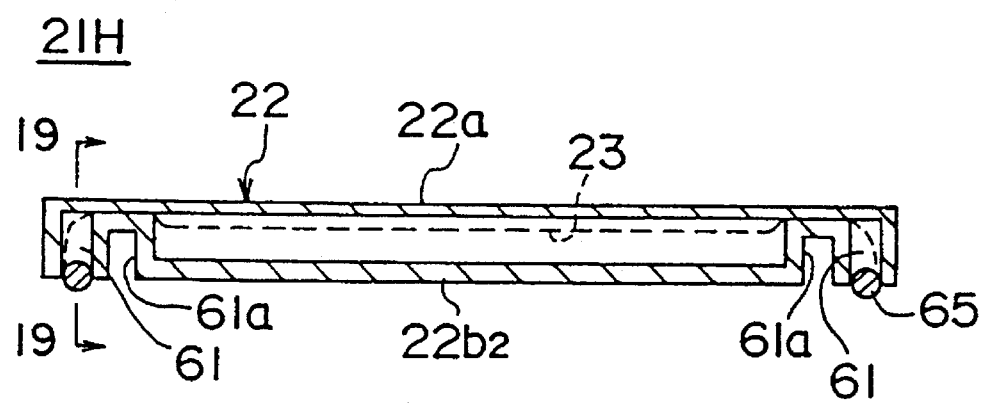
FIGS. 19A and 19B are cross sectional views of the cover unit produced according to the method of FIGS. 18A and 18B.
Figure 19B:
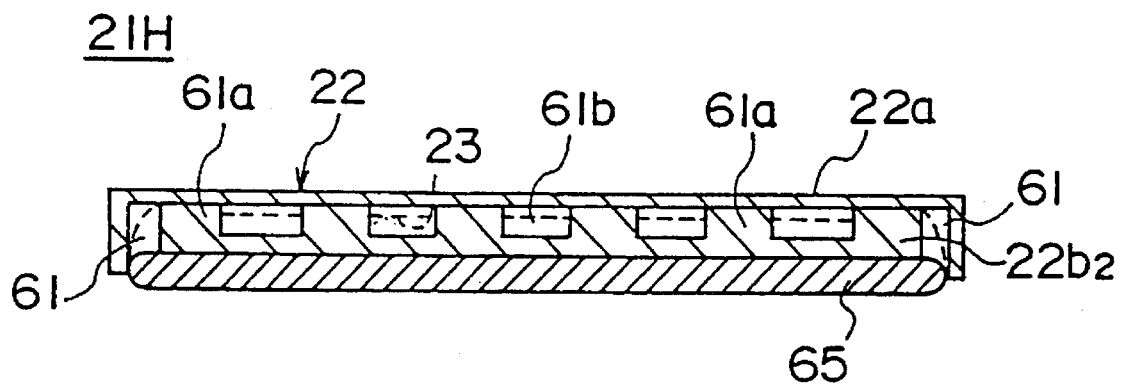

FIGS. 19A and 19B are cross sectional views of the cover produced by the molding apparatus $31_E$. FIG. 19A is a side cross sectional view of the cover unit, and FIG. 19B is a cross sectional view taken along the line C—C of FIG. 19A. A cover unit $21_H$ shown in FIGS. 19A and 19B is constructed such that a predetermined number of projections 61a corresponding to the air ventilating grooves 63a of the projection 63 provided in the lower die $32b_1$, at the periphery of the lower cover 22b. The packing holding groove 61 is formed between the upper cover 22a and the lower cover 22b. The conductive packing 65 is press-fitted into the packing holding groove 61.

Figure 20:
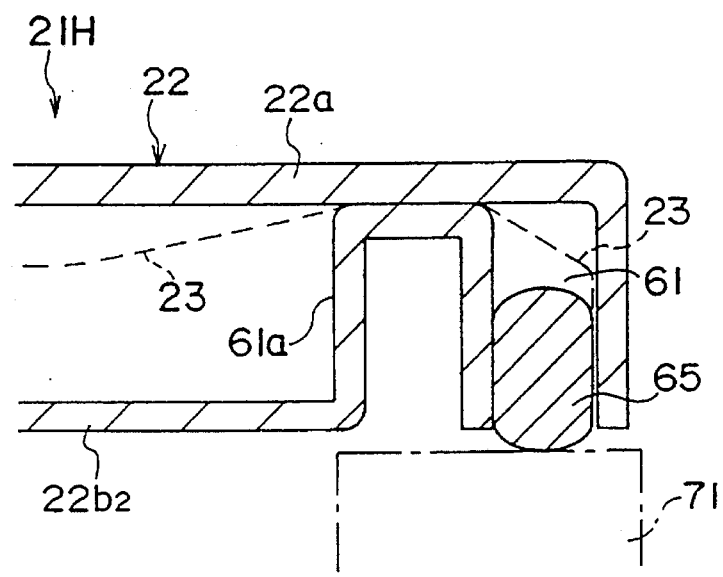
FIG. 20 is a partial enlarged view showing how the cover unit of the eighth embodiment is used.
Figure 21:
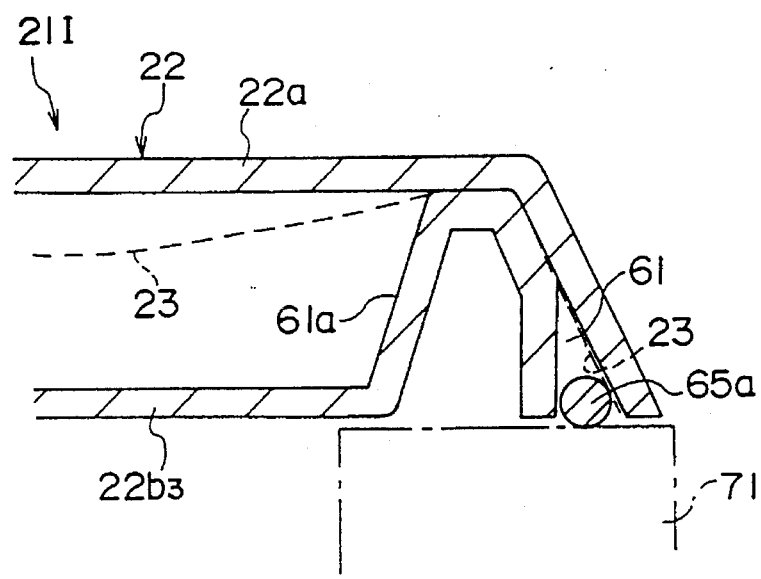
FIG. 21 is a partial enlarged view of another configuration of a holding groove.

FIG. 20 is a partial enlarged view showing how the cover unit $21_H$ of the eight embodiment is used. FIG. 21 shows a partial enlarged view of another configuration of the packing holding groove.

FIG. 20 shows how the cover $21_H$ is fitted to a predetermined apparatus, a frame 71 of the apparatus being electrically connected to the conductive packing 65. Since the conductive packing 65 is in electrically connected to the conductive body 23 within the packing holding groove 61, the conductive body 23 and the frame 71 are electrically connected to each other. Accordingly, the electromagnetic shielding effect of the conductive body 23 is enhanced.

FIG. 21 shows a configuration in which the area occupied by the packing holding groove 61 in the cover $21_H$ is made small to enable a small conductive packing 65a to be used. Specifically, the upper cover 22a of the cover 22 is bent to form a slope at the periphery, and the projection 61a of the lower cover $22b_3$ is made to match the configuration of the bent part of the upper cover 22a.

Electrical connection is established between the conductive body 23 and the frame 71 by bringing the conductive packing 65a into contact with the frame 71 of the apparatus so that electromagnetic shielding effect is realized.

Figure 22:
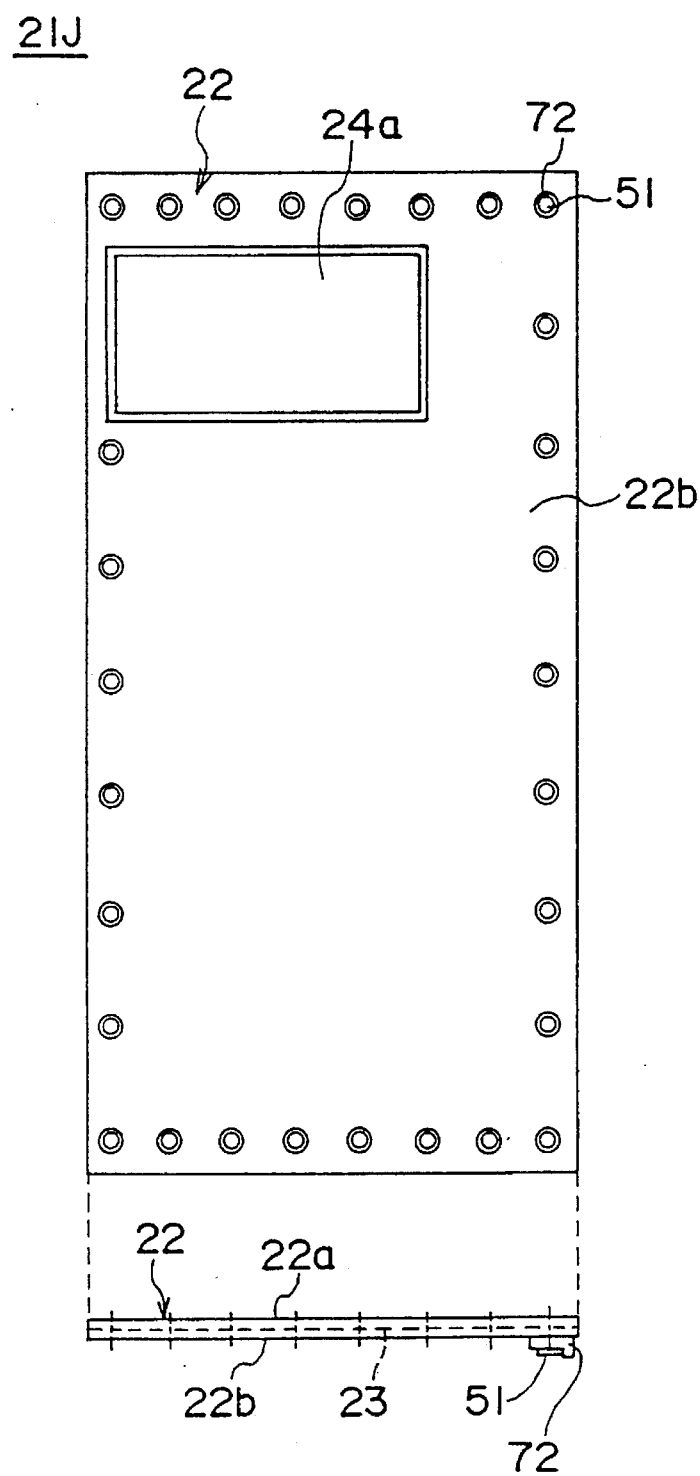
FIG. 22 illustrates a construction of a ninth embodiment.

FIG. 22 shows a construction of a ninth embodiment of the present invention. A cover unit $21_I$ shown in FIG. 22 is constructed such that the conductive body 23 is provided in the hollow cover 22, a predetermined number of stoppers 51 are driven into the lower cover 22b and the conductive body 23 via the conductive packing 72, at the periphery of the cover 22.

Specifically, electrical connection is established between the conductive body 23 and the conductive packing 72 by the stopper 51. Electromagnetic shielding by the conductive body 23 is achieved by allowing the conductive packing 72 to be in contact with the frame of the apparatus.

Figure 23A:
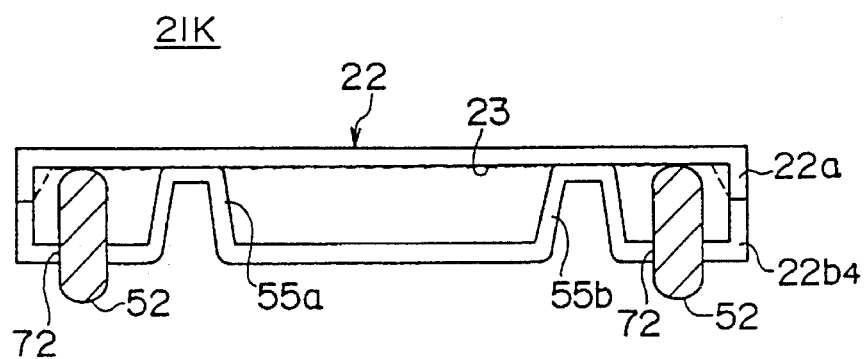
FIGS. 23A and 23B illustrate a construction of a tenth embodiment.
Figure 23B:
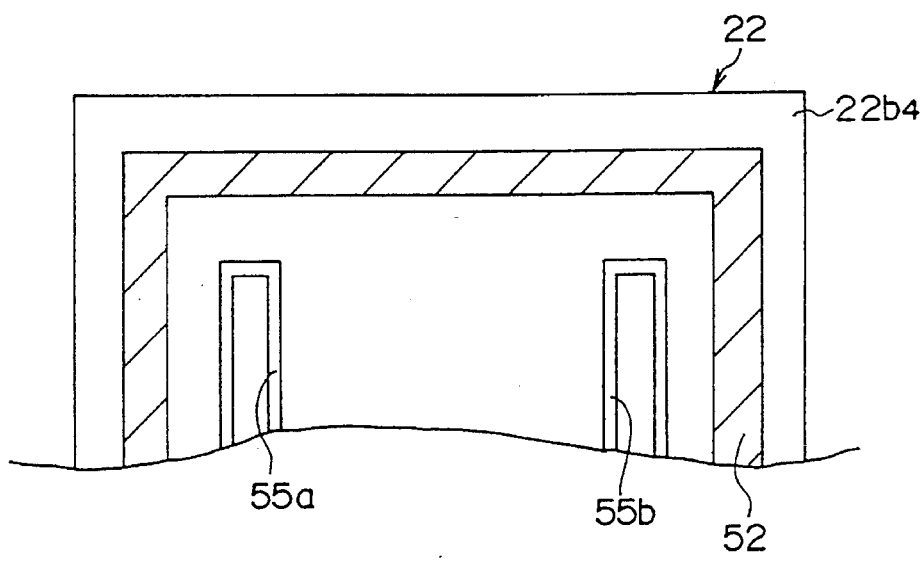

FIGS. 23A and 23B show a construction of a tenth embodiment of the present invention. FIG. 23A is a cross sectional view of a cover unit $21_K$ of the tenth embodiment, and FIG. 23B is a partial rear view of the cover unit $21_K$.

The cover unit $21_K$ shown in FIGS. 23A and 23B is constructed such that rows of pressing parts, for example two rows of pressing parts 55a and 55b, are formed to bulge from the lower cover $22b_4$. The pressing parts 55a and 55b press the conductive body 23 against the upper cover 22a. An annular opening is 72 is formed around the pressing parts 55a and 55b of the lower cover $22b_4$.

The conductive packing 52 is press-fitted into the opening 72 so as to be in contact with and electrically connected with the conductive body 23. The conductive packing 52 is exposed from the lower cover 22b₄ and is brought into contact with the body or the frame to which the cover 21_K is assembled so that electrical connection is established and electromagnetic shielding is achieved.

Figure 24A:
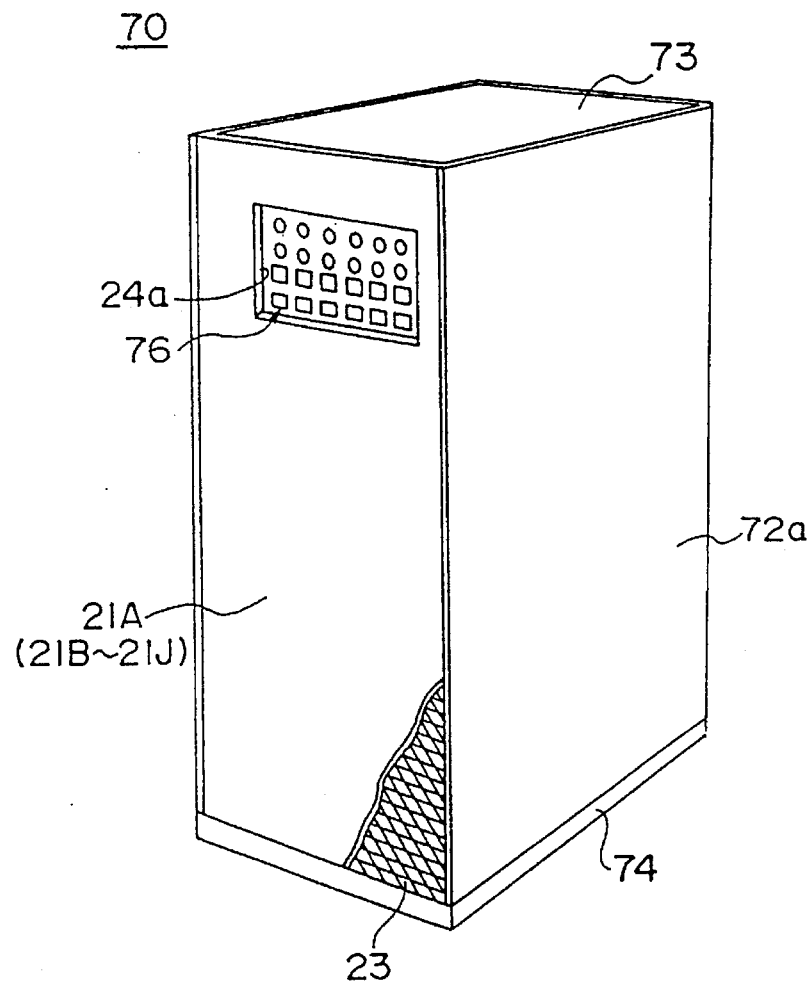
FIGS. 24A and 24B explain an application of the present invention.
Figure 24B:
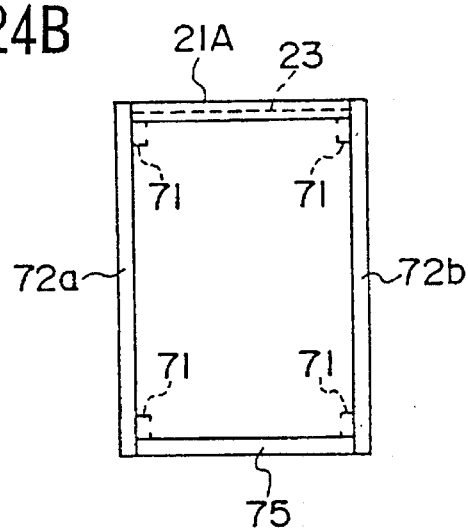

FIGS. 24A and 24B explain an application of the present invention. FIG. 24A is a schematic view with parts broken away, and FIG. 24B is a top view showing the internal arrangement.

FIGS. 24A and 24B show a large information processing unit 70 in which the cover units 21_A–21_K of the aforementioned embodiments are employed as a door. Side plates 72a, 72b, a top plate 73, a bottom plate 74, and a rear plate 75 are fitted to the frame 71, and the cover unit 21_A (21_B–21_K) is fitted between the side plates 72a and 72b as a door.

Electromagnetic shielding effect can be achieved by the conductive body 23 of the cover unit 21_A (21_B–21_K) and by the frame 71. Due to the electrical connection between the frame 71 and the conductive body 23 via the conductive packing 52 and 65, electromagnetic shielding effect is enhanced.

A panel 76 is exposed through the opening 24a of the cover unit 21_A (21_B–21_K).

While FIGS. 24A and 24B show how the cover units 21_A–21_K of the present invention is applied to a door of a large information processing unit 70, the cover units 21_A–21_K may be applied to the side plates 72a, 72b, the top plate 73, the bottom plate 74, or the rear plate 75. In addition to the large information processing unit 70, the cover units 21_A–21_K may also be applied to office automation equipment like copying machines, or electronic equipment like communication equipment.

The present invention is not limited to the above described embodiments, and variations and modifications may be made without departing from the scope of the present invention.

What is claimed is:

1. A molded plastic product comprising:

a molded plastic part of a predetermined size having a hollow space; and a shielding part which, provided on the entirety of a plane in the hollow space of said molded plastic part, effects electromagnetic shielding.

2. The molded plastic product as claimed in claim 1, wherein the periphery of the shielding part is firmly fixed to said molded plastic part.

3. The molded plastic product as claimed in claim 1 or claim 2, wherein the shielding part is fixed to an inner wall of one of opposite sections of said molded plastic part by an adhesive member.

4. The molded plastic product as claimed in claim 3, wherein the adhesive member is a thermosetting member.

5. The molded plastic product as claimed in claim 1 or 2, wherein the shielding part is formed of one a wire netting, a metal plate in which a predetermined number of holes are formed, a metal foil, a conductive plastic, and a conductive synthetic rubber.

6. The molded plastic product as claimed in claim 1, wherein the periphery of the shielding part is made to go out from said molded plastic part as a lead part, and an elastic conductive member is provided at the periphery of one of opposite sections of said molded plastic part so as to be electrically connected to said lead part.

7. The molded plastic product as claimed in claim 6, wherein the lead part and said conductive member are electrically connected to each other by a conductive stopper.

8. The molded plastic product as claimed in claim 6 or claim 7, wherein an opening for allowing the lead part to go out is formed in said molded plastic part.

9. The molded plastic product as claimed in claim 6 or claim 7, wherein electrical connection between the lead part and said conductive member is effected by a conductive connecting member.

10. The molded plastic product as claimed in claim 1, wherein an elastic conductive member is provided at the periphery of one of opposite sections of the molded plastic part, a projection is formed in said molded plastic part so as to press the periphery of said shielding part toward an inner wall of said molded plastic part at a position corresponding to said conductive member.

11. The molded plastic product as claimed in claim 10, wherein electrical connection between said conductive member, said molded plastic part and said shielding part is established by a conductive stopper.

12. The molded plastic product as claimed in claim 1, wherein one of opposite sections of the molded plastic part is formed with a holding groove, and an elastic conductive member electrically connected to the bottom of said holding groove is provided in said holding groove, said holding groove and the inner wall of the other of the opposite sections of the molded plastic part sandwich said shielding part.

13. The molded plastic product as claimed in claim 12, wherein a conductive inserted member for holding said conductive member and establishing electrical connection between said conductive member and the bottom of said holding groove is disposed in the holding groove.

14. The molded plastic product as claimed in claim 1, wherein a holding groove is formed at the periphery of the molded plastic part by a projection at the periphery of one of opposite sections of the molded plastic part and by an end of the other of the opposite sections of the molded plastic part, and an elastic conductive member is press-fitted into said holding groove, the shielding part being caused to extend to the holding groove.

15. The molded plastic product as claimed in claim 14, wherein the projection is provided so as to separate the hollow space of said molded plastic part and said holding groove.

16. The molded plastic product as claimed in claim 14, wherein the projection is formed into a shape that allows air to flow between the hollow space of said molded plastic part and said holding groove.

17. The molded plastic product as claimed in claim 1, wherein electrical connection is established between the molded plastic part and said shielding part by a conductive stopper.

18. The molded plastic product as claimed in claim 17, wherein a conductive member is disposed between the surface of the molded plastic part and the head of said stopper.

19. The molded plastic product as claimed in claim 3, wherein the shielding part is formed of a wire netting, a metal plate in which a predetermined number of holes are formed, a metal foil, a conductive plastic, or a conductive synthetic rubber.

\* \* \* \* \*